United States Patent
Choi et al.

(10) Patent No.: US 10,658,452 B2
(45) Date of Patent: May 19, 2020

(54) DISPLAY APPARATUS

(71) Applicant: SAMSUNG DISPLAY CO., LTD., Yongin-si, Gyeonggi-Do (KR)

(72) Inventors: Chulhyun Choi, Yongin-si (KR); Zail Lhee, Yongin-si (KR); Keunsoo Lee, Yongin-si (KR); Kyungchan Chae, Yongin-si (KR); Kwangmin Kim, Yongin-si (KR); Wonkyu Kwak, Yongin-si (KR); Kiwook Kim, Yongin-si (KR); Yangwan Kim, Yongin-si (KR); Hyunjoon Kim, Yongin-si (KR); Jisu Na, Yongin-si (KR); Joongsoo Moon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/363,145

(22) Filed: Mar. 25, 2019

(65) Prior Publication Data
US 2019/0312097 A1    Oct. 10, 2019

(30) Foreign Application Priority Data
Apr. 6, 2018  (KR) ................. 10-2018-0040599

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 27/3248* (2013.01); *H01L 51/5293* (2013.01)

(58) Field of Classification Search
CPC ............. H01L 27/3276; H01L 51/5293; H01L 27/3248; H01L 27/3246; H01L 51/5203;
(Continued)

(56) References Cited

U.S. PATENT DOCUMENTS 9,136,315 B1    9/2015 Kim et al.
2012/0139000 A1*    6/2012 Lee .................... H01L 27/1255
                                                              257/99

(Continued)

FOREIGN PATENT DOCUMENTS

KR    1020130071249    6/2013
KR    1020150139026    12/2015
(Continued)

*Primary Examiner* — Su C Kim
(74) *Attorney, Agent, or Firm* — F. Chau & Associates, LLC

(57) ABSTRACT

A display apparatus includes a substrate including a display area and a peripheral area disposed outside of the display area, a plurality of wiring lines disposed in the peripheral area, and an interlayer insulating layer covering the plurality of wiring lines. The interlayer insulating layer includes an upper surface having a first concave-convex surface corresponding to the plurality of wiring lines. The display apparatus further includes a first conductive layer disposed on the interlayer insulating layer and including a second upper surface having a second concave-convex surface corresponding to the first concave-convex surface, a planarization layer disposed on the first conductive layer and having a flat upper surface, a second conductive layer disposed on the planarization layer and having a flat upper surface, and a polarization plate disposed on the second conductive layer.

33 Claims, 16 Drawing Sheets

(58) Field of Classification Search
CPC ............... H01L 27/3258; H01L 27/124; H01L 51/5281
See application file for complete search history.

(56) References Cited

U.S. PATENT DOCUMENTS

2016/0343792 A1\* 11/2016 Jang .................... H01L 27/3276
2017/0062772 A1   3/2017 Chu et al.
2018/0166019 A1\* 6/2018 Lee ..................... H01L 27/3276

FOREIGN PATENT DOCUMENTS

| KR | 10-1658149    | 9/2016 |
| KR | 1020170054715 | 5/2017 |
| KR | 1020170080285 | 7/2017 |

\* cited by examiner

DISPLAY APPARATUS

CROSS-REFERENCE TO RELATED APPLICATIONS

This application claims priority under 35 U.S.C. § 119 to Korean Patent Application No. 10-2018-0040599, filed on Apr. 6, 2018 in the Korean Intellectual Property Office, the disclosure of which is incorporated by reference herein in its entirety.

TECHNICAL FIELD

Exemplary embodiments relate to a display apparatus, and more particularly, to a display apparatus capable of preventing or reducing image quality degradation caused by external light.

DISCUSSION OF RELATED ART

A display apparatuses has a display area in which pixels are located. Components such as wiring lines for transmitting electrical signals to be applied to the pixels located in the display area, a circuit unit, etc. are located in a peripheral area outside the display area. External light may be reflected by the wiring lines, and this reflection may cause quality degradation of an image seen by a user.

SUMMARY

Exemplary embodiments include a display apparatus capable of preventing image quality degradation caused by external light.

According to an exemplary embodiment, a display apparatus includes a substrate including a display area and a peripheral area disposed outside of the display area, a plurality of wiring lines disposed in the peripheral area, and an interlayer insulating layer covering the plurality of wiring lines. The interlayer insulating layer includes an upper surface having a first concave-convex surface corresponding to the plurality of wiring lines. The display apparatus further includes a first conductive layer disposed on the interlayer insulating layer and including a second upper surface having a second concave-convex surface corresponding to the first concave-convex surface, a planarization layer disposed on the first conductive layer and having a flat upper surface, a second conductive layer disposed on the planarization layer and having a flat upper surface, and a polarization plate disposed on the second conductive layer.

In an exemplary embodiment, the plurality of wiring lines includes a plurality of first wiring lines and a plurality of second wiring lines.

In an exemplary embodiment, the plurality of first wiring lines and the plurality of second wiring lines are alternately disposed.

In an exemplary embodiment, the display apparatus further includes a first gate insulating layer disposed below the plurality of first wiring lines, and a second gate insulating layer disposed below the interlayer insulating layer and covering the plurality of first wiring lines. The plurality of second wiring lines is disposed on the second gate insulating layer and corresponds to spaces between the plurality of first wiring lines.

In an exemplary embodiment, the second conductive layer includes a through hole disposed above the plurality of wiring lines.

In an exemplary embodiment, the display apparatus further includes an additional insulating layer filling the through hole.

In an exemplary embodiment, the additional insulating layer is disposed between the second conductive layer and the polarization plate.

In an exemplary embodiment, the additional insulating layer exposes at least a portion of the upper surface of the second conductive layer.

In an exemplary embodiment, the display apparatus further includes a light-emitting device disposed in the display area and including a pixel electrode, an intermediate layer including an emission layer, and an opposite electrode. The pixel electrode, the intermediate layer, and the opposite electrode are sequentially stacked, and the opposite electrode extends to the peripheral area and contacts the upper surface of the second conductive layer.

In an exemplary embodiment, the second conductive layer is electrically connected to the first conductive layer.

In an exemplary embodiment, the second conductive layer includes a first portion and a second portion spaced apart from each other.

In an exemplary embodiment, a space between the first portion and the second portion is aligned with one of the plurality of wiring lines.

In an exemplary embodiment, the display apparatus further includes an additional insulating layer filling a space between the first portion and the second portion.

In an exemplary embodiment, the additional insulating layer is disposed between the second conductive layer and the polarization plate.

In an exemplary embodiment, the additional insulating layer exposes at least a portion of an upper surface of the first portion.

In an exemplary embodiment, the display apparatus further includes a light-emitting device disposed in the display area and including a pixel electrode, an intermediate layer including an emission layer, and an opposite electrode. The pixel electrode, the intermediate layer, and the opposite electrode are sequentially stacked, and the opposite electrode extends to the peripheral area and contacts the upper surface of the first portion.

In an exemplary embodiment, the first portion is electrically connected to the first conductive layer.

In an exemplary embodiment, the second portion is electrically connected to the pixel electrode.

In an exemplary embodiment, the second conductive layer includes a plurality of interconnection lines.

In an exemplary embodiment, the display apparatus further includes an additional insulating layer filling spaces between the plurality of interconnection lines.

In an exemplary embodiment, the additional insulating layer is disposed between the second conductive layer and the polarization plate.

In an exemplary embodiment, the display apparatus further includes a driving circuit disposed in the peripheral area. The driving circuit generates an electrical signal to be applied to a plurality of display devices disposed in the display area, and the plurality of interconnection lines is electrically connected to the driving circuit.

In an exemplary embodiment, the display apparatus further includes an additional insulating layer disposed between the second conductive layer and the polarization plate and having a flat upper surface, and a third conductive layer disposed between the additional insulating layer and the polarization plate and having a flat upper surface.

In an exemplary embodiment, the third conductive layer includes a plurality of additional wiring lines, and a plurality of spaces disposed between the plurality of additional wiring lines is disposed above the plurality of interconnection lines.

In an exemplary embodiment, the third conductive layer includes a first portion and a second portion spaced apart from each other.

In an exemplary embodiment, a space between the first portion and the second portion is disposed above the plurality of interconnection lines.

In an exemplary embodiment, the display apparatus further includes a light-emitting device disposed in the display area and including a pixel electrode, an intermediate layer including an emission layer, and an opposite electrode. The pixel electrode, the intermediate layer, and the opposite electrode are sequentially stacked, and the opposite electrode extends to the peripheral area and contacts an upper surface of the first portion.

In an exemplary embodiment, the first portion is electrically connected to the first conductive layer.

In an exemplary embodiment, the second portion is electrically connected to the pixel electrode.

In an exemplary embodiment, the display apparatus further includes a light-emitting device disposed in the display area and including a pixel electrode, an intermediate layer including an emission layer, and an opposite electrode. The pixel electrode, the intermediate layer, and the opposite electrode are sequentially stacked, and the second conductive layer is disposed on a same layer as the pixel electrode.

In an exemplary embodiment, the display apparatus further includes a light-emitting device disposed in the display area and including a pixel electrode, an intermediate layer including an emission layer, and an opposite electrode. The pixel electrode, the intermediate layer, and the opposite electrode are sequentially stacked. The display apparatus further includes a first thin film transistor disposed below the light-emitting device, and including a first gate electrode and a first source electrode disposed above the first gate electrode. The display apparatus further includes an intermediate conductive layer disposed between the first source electrode and the light-emitting device. The first conductive layer is disposed on a same layer as the first source electrode, and the second conductive layer is disposed on a same layer as the intermediate conductive layer.

In an exemplary embodiment, the intermediate conductive layer is a second source electrode.

According to an exemplary embodiment, a display apparatus includes a substrate including a display area and a peripheral area disposed outside of the display area, an interlayer insulating layer disposed in the peripheral area and including an upper surface having a first concave-convex surface, a first conductive layer disposed on the interlayer insulating layer and including an upper surface having a second concave-convex surface corresponding to the first concave-convex surface, a planarization layer disposed on the first conductive layer and having a flat upper surface, a second conductive layer disposed on the planarization layer and having a flat upper surface, and a polarization plate disposed on the second conductive layer.

According to an exemplary embodiment as described above, a display apparatus capable of preventing image quality degradation caused by external light may be realized. However, the scope of the disclosure is not limited thereto.

BRIEF DESCRIPTION OF THE DRAWINGS

The above and other aspects will become more apparent by describing in detail exemplary embodiments thereof with reference to the accompanying drawings, in which.

DETAILED DESCRIPTION

Figure 1:
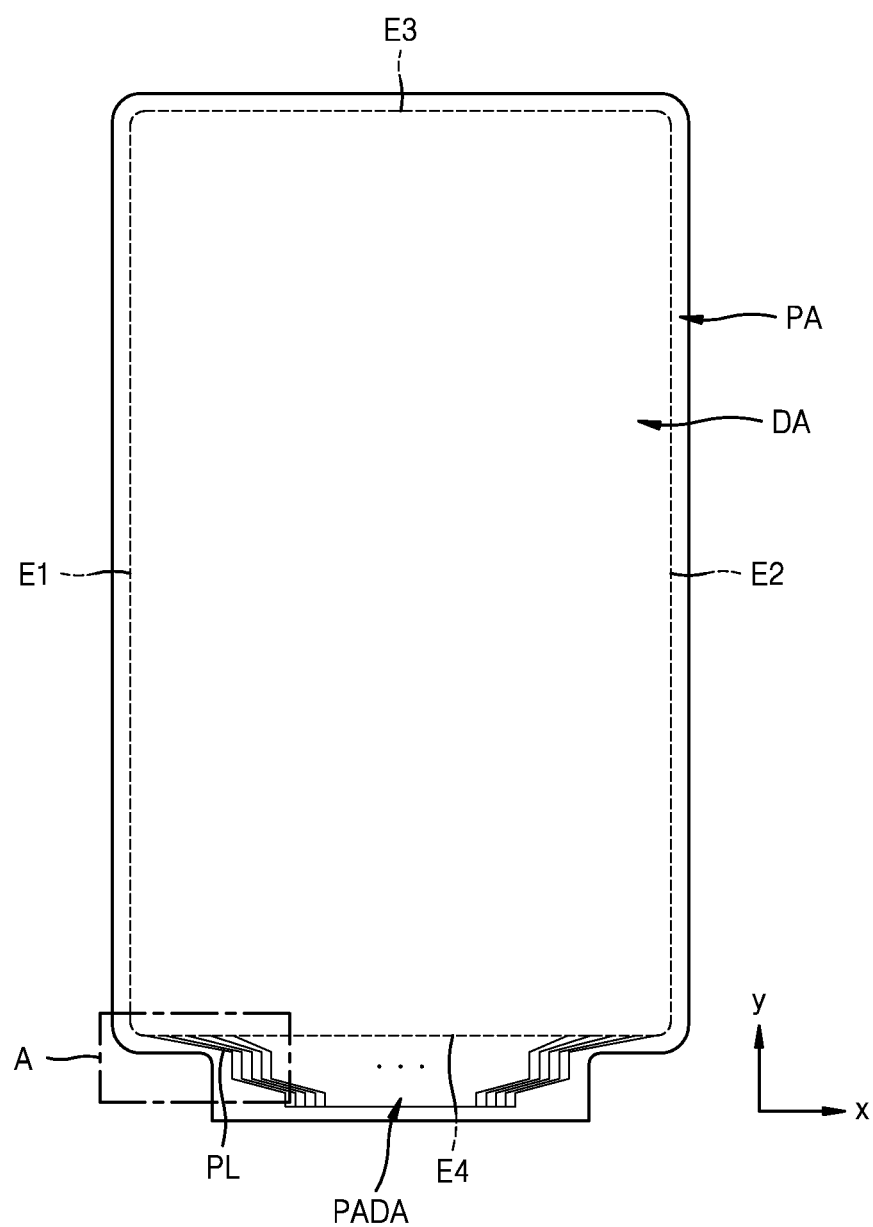
FIG. 1 is a schematic conceptual view of a portion of a display apparatus according to an exemplary embodiment.

Exemplary embodiments will be described more fully hereinafter with reference to the accompanying drawings Like reference numerals may refer to like elements throughout the accompanying drawings. In the figures, elements that are the same or are in correspondence are denoted by the same reference numeral regardless of the figure number, and redundant explanations are omitted.

It will be understood that, unless otherwise specified, when an element such as a layer, film, region or substrate is referred to as being "on" another element, it may be "directly" on the other element or intervening elements may also be present.

In the disclosure, the x-axis, the y-axis and the z-axis are not limited to the three axes of the rectangular coordinate system and may be interpreted in a broader sense. In an exemplary embodiment, the x-axis, the y-axis, and the z-axis may be perpendicular to one another or may represent different directions that are not perpendicular to one another.

It will be understood that the terms "first," "second," "third," etc. are used herein to distinguish one element from another, and the elements are not limited by these terms.

Thus, a "first" element in an exemplary embodiment may be described as a "second" element in another exemplary embodiment.

Figure 2:
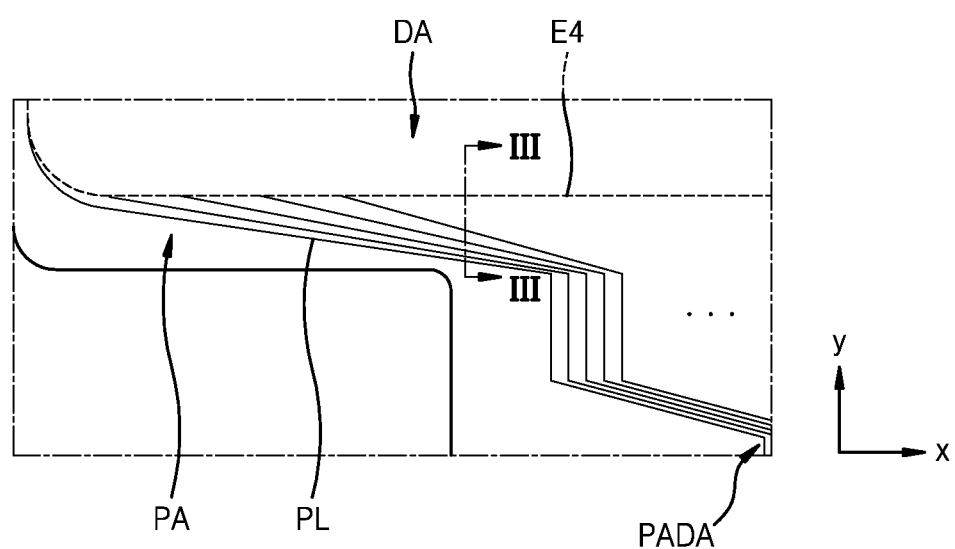
FIG. 2 is a schematic conceptual view of portion A of the display apparatus of FIG. 1.

FIG. 1 is a schematic conceptual view of a portion of a display apparatus according to an exemplary embodiment. FIG. 2 is a schematic conceptual view of portion A of the display apparatus of FIG. 1.

As shown in FIG. 1, the display apparatus according to an exemplary embodiment includes a substrate that includes a display area DA in which a plurality of pixels are located, and a peripheral area PA disposed around the display area DA. The peripheral area PA includes a pad area PADA to which various electronic devices such as, for example, an integrated circuit (IC), a printed circuit board (PCB) etc., may be electrically connected.

FIG. 1 may be understood as a plan view showing a substrate during the manufacture of the display apparatus. In an electronic device, such as a fully manufactured display apparatus, a smartphone including a display apparatus, etc., a portion of a substrate or the like may be bent in order to minimize or reduce the area of the peripheral area PA recognized by a user. For example, as shown in FIGS. 1 and 2, the substrate may have portions that have different widths in the x-axis direction, and the substrate may be bent at a narrow portion (about a bending axis parallel to the x-axis). In this case, at least a portion of the pad area PADA may overlap the display area DA. A bending direction is set such that the pad area PADA does not cover the display area DA but is located behind the display area DA. Accordingly, a user recognizes that the display area DA occupies most of the display apparatus.

The substrate may include various materials having flexible or bendable characteristics. For example, the substrate may include a polymer resin such as polyether sulphone (PES), polyacrylate, polyetherimide (PEI), polyethylene naphthalate (PEN), polyethylene terephthalate (PET), polyphenylene sulfide (PPS), polyallyrate (PAR), polyimide (PI), polycarbonate (PC), or cellulose acetate propionate (CAP). The substrate may have a multi-layered structure including two layers including a polymer resin and a barrier layer including an inorganic material (e.g., silicon oxide, silicon nitride, silicon oxynitride, etc.) between the two layers. In this way, various modifications may be made. In a case in which a display apparatus is not required to be bent, the substrate may include glass.

An edge of the display area DA may have a shape that is similar to a rectangle or a square. For example, the display area DA may include a first edge E1 and a second edge E2 opposite to each other, and a third edge E3 and a fourth edge E4 opposite to each other and located between the first edge E1 and the second edge E2. The pad area PADA is adjacent to the fourth edge E4. In this case, a first portion connecting the first edge E1 to the fourth edge E4 may have a round shape. In addition, a second portion connecting the second edge E2 to the fourth edge E4 may also have a round shape. Also, the display area DA may have a round shape at portions other than the first and second portions.

Figure 3:
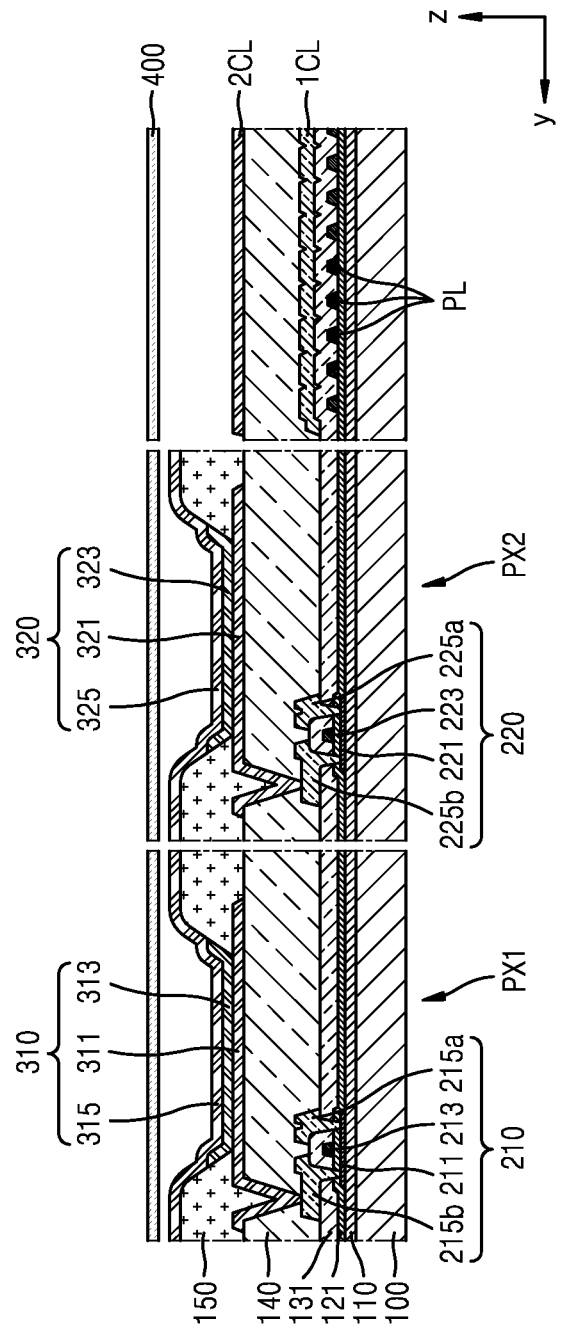
FIG. 3 is a schematic cross-sectional view taken along line III-III of FIG. 2.

FIG. 3 is a schematic cross-sectional view taken along line III-III of FIG. 2. FIG. 3 is a cross-sectional view illustrating portions spaced apart from each other in FIG. 2, and thus, does not show adjacent components. For example, FIG. 3 illustrates a pixel PX1 and a pixel PX2. Referring to FIG. 3, the pixel PX1 and the pixel PX2 are not close to each other (e.g., are not directly adjacent to each other). In addition, FIG. 3 is a cross-sectional view illustrating portions spaced apart from each other in FIG. 2, and thus, cross-sections of the spaced-apart portions may not be in the same direction. For example, a cross-section of the pixel PX1 may not be on the same plane as a plane of a cross-section of a plurality of wiring lines PL. For example, for convenience of illustration, the line III-III in FIG. 2 is shown as a straight line, however, in practice, the line III-III in FIG. 2 may be a curved line or a line bent several times. FIG. 3 may be understood as a cross-sectional view illustrating the pixel PX1 and the pixel PX2 in the display area DA of FIG. 2 and some of the plurality of wiring lines PL in the peripheral area PA of FIG. 2.

As shown in FIG. 3, in an exemplary embodiment, first and second display devices 310 and 320 and first and second thin film transistors 210 and 220 electrically connected to the first and second display devices 310 and 320 may be located in the display area DA of a substrate 100. The first and second display devices 310 and 320 may be, for example, organic light-emitting devices. The organic light-emitting devices electrically connected to the first and second thin film transistors 210 and 220 may be understood as the first and second pixel electrodes 311 and 321 respectively electrically connected to the first and second thin film transistors 210 and 220.

According to an exemplary embodiment, FIG. 3 illustrates an example in which the first thin film transistor 210 is located in the first pixel PX1, the second thin film transistor 220 is located in the second pixel PX2, the first display device 310 is electrically connected to the first thin film transistor 210, and the second display device 320 is electrically connected to the second thin film transistor 220. Hereinafter, for convenience of explanation, the first thin film transistor 210 and the first display device 310 will be described. This description is equally applicable to the second thin film transistor 220 and the second display device 320. For example, descriptions of a second semiconductor layer 221, a second gate electrode 223, a second source electrode 225a, and a second drain electrode 225b of the second thin film transistor 220, and descriptions of the second pixel electrode 321, an opposite electrode 325, and an intermediate layer 323 of the second display device 320 will be omitted. In an exemplary embodiment, the opposite electrode 325 of the second display device 320 may be integrally formed with an opposite electrode 315 of the first display device 310.

The first thin film transistor 210 may include a first semiconductor layer 211, a first gate electrode 213, a first source electrode 215a, and a first drain electrode 215b. The first semiconductor layer 211 may include, for example, amorphous silicon, crystalline silicon, or an organic semiconductor material. To secure insulation between the first semiconductor layer 211 and the first gate electrode 213, a first gate insulating layer 121 may be disposed between the first semiconductor layer 211 and the first gate electrode 213. The first gate insulating layer 121 may include, for example, an inorganic material such as silicon oxide, silicon nitride, and/or silicon oxynitride. A first interlayer insulating layer 131 may be disposed over the first gate electrode 213 and may include, for example, an inorganic material such as silicon oxide, silicon nitride, and/or silicon oxynitride. The first source electrode 215a and the first drain electrode 215b may be disposed on the first interlayer insulating layer 131. Such an insulating layer including an inorganic material may be formed via, for example, chemical vapor deposition (CVD) or atomic layer deposition (ALD). This is equally applicable to exemplary embodiments to be described later and modifications thereof.

The first gate electrode 213, the first source electrode 215a, and the first drain electrode 215b may include various conductive materials. For example, the first gate electrode 213 may include molybdenum (Mo) or aluminum (Al), and, in exemplary embodiments, may have a multi-layered structure. In an exemplary embodiment, the first gate electrode 213 may be a three-layered structure including an Mo layer, an Al layer, and an Mo layer. The first source electrode 215a and the first drain electrode 215b may include, for example, titanium (Ti) or Al. According to exemplary embodiments, each of the first source electrode 215a and the first drain electrode 215b may have a multi-layered structure. In an exemplary embodiment, each of the first source electrode 215a and the first drain electrode 215b may be a three-layered structure including, for example, a Ti layer, an Al layer, and a Ti layer. However, it is to be understood that exemplary embodiments are not limited thereto.

A buffer layer 110 may be disposed between the first thin film transistor 210 and the substrate 100, and may include an inorganic material such as, for example, silicon oxide, silicon nitride, and/or silicon oxynitride. The buffer layer 110 may increase smoothness of an upper surface of the substrate 100, and may prevent or reduce infiltration of impurities from the substrate 100 into the first semiconductor layer 211 of the first thin film transistor 210.

A planarization layer 140 may be disposed on the first thin film transistor 210. In an exemplary embodiment, when an organic light-emitting device is disposed over the first thin film transistor 210 as illustrated in FIG. 3, the planarization layer 140 may planarize an upper portion of a protection layer that covers the first thin film transistor 210. The planarization layer 140 may include an organic material such as, for example, benzocyclobutene (BCB) or hexamethyldisiloxane (HMDSO). Although the planarization layer 140 is shown as being a single layer in FIG. 3, various modifications may be made to the planarization layer 140. For example, in an exemplary embodiment, the planarization layer 140 may be a stack of multiple layers.

The first display device 310 may be located on the planarization layer 140 in the display area DA of the substrate 100. In an exemplary embodiment, the first display device 310 may be an organic light-emitting device having the first pixel electrode 311, the opposite electrode 315, and an intermediate layer 313 disposed between the first pixel electrode 311 and the opposite electrode 315. The intermediate layer 313 may include an emission layer. The first pixel electrode 311 may contact one of the first source electrode 215a and the first drain electrode 215b via an opening formed in the planarization layer 140, as shown in FIG. 3, and is electrically connected to the first thin film transistor 210. The first pixel electrode 311 may include, for example, ITO, IZO, or $In_2O_3$. The first pixel electrode 311 may include a material different from the aforementioned material, as necessary. In an exemplary embodiment, the first pixel electrode 311 may include a metal such as, for example, Al or copper (Cu).

A pixel-defining layer 150 may be disposed over the planarization layer 140. The pixel-defining layer 150 defines pixels by including respective openings corresponding to sub-pixels. For example, the pixel-defining layer 150 may include an opening via which at least a center portion of the first pixel electrode 311 is exposed. In such a case as illustrated in FIG. 3, the pixel-defining layer 150 prevents an arc or the like from occurring on an edge of the first pixel electrode 311 by increasing a distance between the edge of the first pixel electrode 311 and the opposite electrode 315 arranged over the first pixel electrode 311. The pixel-defining layer 150 may include an organic material such as, for example, PI or HMDSO.

The intermediate layer 313 of the organic light-emitting device may include a low-molecular or high-molecular weight material. When the intermediate layer 313 includes a low-molecular weight material, the intermediate layer 313 may have a structure in which a hole injection layer (HIL), a hole transport layer (HTL), an emission layer (EML), an electron transport layer (ETL), and an electron injection layer (EIL) are stacked in a single or complex structure. The intermediate layer 313 may be formed, for example, by vacuum deposition. When the intermediate layer 313 includes a high-molecular weight material, the intermediate layer 313 may have a structure including an HTL and an EML. In this case, the HTL may include poly(3,4-ethylene-dioxythiophene) (PEDOT), and the EML may include a high-molecular weight material such as a polyphenylenevinylene (PPV)-based material or a polyfluorene-based material. The intermediate layer 313 may be formed, for example, by screen printing, inkjet printing, laser induced thermal imaging (LITI), etc. The intermediate layer 313 is not limited to the above-described structure, and may have any of various other structures. The intermediate layer 313 may include a single layer that covers a plurality of first and second pixel electrodes 311 and 321, or may include patterned layers respectively corresponding to the plurality of first and second pixel electrodes 311 and 321.

The opposite electrode 315 may be disposed over the display area DA and may cover the display area DA. For example, the opposite electrode 315 may be formed as a single body constituting a plurality of organic light-emitting devices, and thus, may correspond to the plurality of first and second pixel electrodes 311 and 321.

The plurality of wiring lines PL may be disposed on the first gate insulating layer 121 in the peripheral area PA. In this case, during the manufacture of the display apparatus, the plurality of wiring lines PL may be formed simultaneously with the first gate electrode 213 of the first thin film transistor 210 by using the same material as that of the first gate electrode 213. The plurality of wiring lines PL may transmit an electrical signal that is to be applied to the first or second pixel PX1 or PX2 located in the display area DA, or may transmit an electrical signal that is to be applied to a circuit unit located in the peripheral area PA outside the display area DA. The circuit unit located in the peripheral area PA may be, for example, a shift register that generates a scan signal that is to be applied to scan lines SL located within the display area DA, as will be described later with reference to FIG. 19.

Like the first interlayer insulating layer 131 covering the first gate electrode 213 and the second gate electrode 223 in the display area DA, the first interlayer insulating layer 131 covers the plurality of wiring lines PL in the peripheral area PA. For example, the first interlayer insulating layer 131 may extend from the display area DA to the peripheral area PA. Since the first interlayer insulating layer 131 includes an inorganic material such as silicon oxide, silicon nitride, and/or silicon oxynitride, as described above, an upper surface of the first interlayer insulating layer 131 has a shape corresponding to the components located below the first interlayer insulating layer 131. For example, since the plurality of wiring lines PL are disposed below the first interlayer insulating layer 131, an upper surface of the first interlayer insulating layer 131 has a concave-convex surface corresponding to the plurality of wiring lines PL. Herein, the concave-convex surface of the upper surface of the first interlayer insulating layer 131 may be referred to as a first concave-convex surface. In addition, herein, the terms "concave-convex surface" and "concave-convex pattern" may be used interchangeably.

The first concave-convex surface does not simply mean that there are convex portions and concave portions arbitrarily included in random areas on the surface. As the resolution of the display apparatus increases, the number of wiring lines PL that transmit electrical signals to be applied to the display area DA or a driving circuit unit disposed outside the display area DA also increases. An increase in the proportion of an area occupied by the display area DA in the display apparatus may be achieved by decreasing the area of the peripheral area PA. Accordingly, an interval between the plurality of wiring lines PL that transmit electrical signals is decreased. Accordingly, referring to FIG. 3, the concave-convex surface of the upper surface of the first interlayer insulating layer 131 has "V"-shaped valleys at locations corresponding to the spaces between the plurality of wiring lines PL. Thus, according to exemplary embodiments, the concave-convex surface means a surface having "V"-shaped valleys at locations corresponding to the spaces between the plurality of wiring lines PL as described above. This is the same in exemplary embodiments to be described later, as well as modifications thereof. For example, as shown in FIG. 3, in an exemplary embodiment, the upper surface of the first interlayer insulating layer 131 includes a "V"-shaped valley in each area located between adjacent wiring lines PL. In exemplary embodiments, the "V"-shaped valleys that form the concave-convex surface are disposed only in areas located between adjacent wiring lines PL, and are not disposed in areas that overlap the wiring lines PL. Thus, in exemplary embodiments, the "V"-shaped valleys that form the concave-convex surface of the upper surface of the first interlayer insulating layer 131 do not overlap any of the wiring lines PL disposed below the first interlayer insulating layer 131.

In the peripheral area PA, a first conductive layer 1CL is located on the first interlayer insulating layer 131. Since the first source electrode 215a, the first drain electrode 215b, the second source electrode 225a, and the second drain electrode 225b are located on the first interlayer insulating layer 131 in the display area DA as described above, the first conductive layer 1CL may be formed simultaneously with the first source electrode 215a, the first drain electrode 215b, the second source electrode 225a, and the second drain electrode 225b, by using the same material as that used for the first source electrode 215a, the first drain electrode 215b, the second source electrode 225a, and the second drain electrode 225b, during the manufacture of the display apparatus. As described above, the upper surface of the first interlayer insulating layer 131 has the concave-convex surface corresponding to the plurality of wiring lines PL. That is, the upper surface of the first interlayer insulating layer 131 includes "V"-shaped valleys disposed in locations between adjacent wiring lines PL. Accordingly, an upper surface of the first conductive layer 1CL formed on the first interlayer insulating layer 131 has a concave-convex surface (referred to herein as a second concave-convex surface) corresponding to the concave-convex surface (referred to herein as a first concave-convex surface) of the upper surface of the first interlayer insulating layer 131. For example, as shown in FIG. 3, in an exemplary embodiment, the "V"-shaped valleys of the second concave-convex surface are aligned with the "V"-shaped valleys of the first concave-convex surface. Thus, in an exemplary embodiment, both the "V"-shaped valleys of the second concave-convex surface and the "V"-shaped valleys of the first concave-convex surface are disposed in locations between (and above) adjacent wiring lines PL.

The planarization layer 140 is located on the first conductive layer 1CL, which includes an upper surface having the second concave-convex surface. In the display area DA, the planarization layer 140 is disposed on the first thin film transistor 210 and the second thin film transistor 220. Accordingly, the planarization layer 140 including an organic material has a substantially flat upper surface even when the first thin film transistor 210 and the second thin film transistor 220 are disposed below the planarization layer 140. Also, in the peripheral area PA, the planarization layer 140 is located on the first conductive layer 1CL including an upper surface having the second concave-convex surface, and the upper surface of the planarization layer 140 has a substantially flat shape. During the manufacture of the display apparatus, the planarization layer 140 in the peripheral area PA may be formed simultaneously with the planarization layer 140 in the display area DA by using the same material. Accordingly, the planarization layer 140 in the peripheral area PA may have the same structure as that of the planarization layer 140 in the display area DA. The planarization layer 140 may have a single body structure extending from the display area DA to the peripheral area PA, or may have a discontinuous section within the peripheral area PA.

Herein, when a surface or a portion of a surface is described as being substantially flat, it is to be understood that the surface or the portion of the surface is exactly flat, or almost flat (e.g., within a measurement error), as would be understood by a person having ordinary skill in the art. Further, in exemplary embodiments, when a concave-convex surface is described as including "V"-shaped valleys, the portion of the surface that does not include a "V"-shaped valley is a substantially flat portion of the surface. Thus, in exemplary embodiments, a substantially flat portion of a concave-convex surface refers to the portion of the concave-convex surface that does not include any "V"-shaped valleys.

In the peripheral area PA, a second conductive layer 2CL is located on the planarization layer 140. Since the upper surface of the planarization layer 140 is substantially flat, the upper surface of the second conductive layer 2CL also has a substantially flat shape. Since the first pixel electrode 311 and the second pixel electrode 321 are located on the planarization layer 140 in the display area DA, the second conductive layer 2CL may be formed simultaneously with the first pixel electrode 311 and the second pixel electrode 321 in the same layer as the first pixel electrode 311 and the second pixel electrode 321, by using the same material as that of the first pixel electrode 311 and the second pixel electrode 321, during the manufacture of the display apparatus.

A polarization plate 400 is located over the second conductive layer 2CL. The polarization plate 400 reduces a degree to which external light incident upon the display apparatus is reflected. Thus, visibility of an image displayed in the display area DA may be prevented or reduced from being degraded when a user sees the image. For example, first light, which is a portion of light incident upon the polarization plate 400, enters the polarization plate 400, is reflected by the upper surface of the second conductive layer 2CL, and is emitted back to the outside of the display apparatus via the polarization plate 400. Further, second light, which is another portion of the light incident upon the polarization plate 400, is reflected by the upper surface of the second conductive layer 2CL. At this time, while the first light is passing through the polarization plate 400 twice, a phase of the first light is changed, and thus, may be opposite to a phase of the second light. Accordingly, the first light and the second light destructively interfere with each other, and consequently, visibility of an image displayed in the display area DA may be effectively prevented or reduced from being degraded by external light when a user sees the image displayed in the display area DA. In the display area DA, the opposite electrodes 315 and 325 may serve as the second conductive layer 2CL.

If the second conductive layer 2CL having a flat upper surface is not present in the peripheral area PA, the first light transmitted through the polarization plate 400 is reflected by the upper surface of the first conductive layer 1CL below the polarization plate 400. However, the upper surface of the first conductive layer 1CL includes the second concave-convex surface, as described above. Accordingly, a portion of the first light incident upon the second concave-convex surface is diffusely reflected, and thus, may not promote destructive interference with the second light reflected by the polarization plate 400. For example, when the first light is reflected by "V"-shaped valleys of the second concave-convex surface and not by a relatively flat upper surface (e.g., a substantially flat surface that does not include "V"-shaped valleys) of the second concave-convex surface as shown in FIG. 3, the first light is diffusely reflected, and consequently, and destructive interference may not occur between the first light and the second light reflected by the polarization plate 400. When a user sees external light that is reflected in the peripheral area PA, even though no images are displayed in the peripheral area PA, visibility of an image displayed in the display area DA may be degraded due to the external light when a user sees the image displayed in the display area DA.

In addition, since the second concave-convex surface is formed by the plurality of wiring lines PL disposed below the second concave-convex surface, a portion of the second concave-convex surface by which light is diffusely reflected is consequently a portion corresponding to the plurality of wiring lines PL disposed below the second concave-convex surface. Accordingly, when a user recognizes diffusely-reflected light, this brings the same result as the user recognizing the shape of the plurality of wiring lines PL disposed below the second concave-convex surface. Of course, this degrades entire image visibility of the display apparatus.

However, in the display apparatus according to the exemplary embodiment of FIG. 3, as described above, the planarization layer 140 having a substantially flat upper surface covers the first conductive layer 1CL, and the second conductive layer 2CL having a substantially flat upper surface is located on the planarization layer 140. Accordingly, image visibility degradation as described above may be effectively prevented or reduced.

In FIG. 3, there are no elements illustrated as being located between the second conductive layer 2CL and the polarization plate 400. However, it is to be understood that this is only for convenience of illustration, and that various components may be disposed between the pixel-defining layer 150 covering the second conductive layer 2CL and the polarization plate 400. Since organic light-emitting devices may be damaged by external moisture, oxygen, etc., an encapsulation layer may cover and protect these organic light-emitting devices. Since the encapsulation layer may cover the display area DA and extend over at least a portion of the peripheral area PA, the encapsulation layer may also be located between the second conductive layer 2CL and the polarization plate 400. The encapsulation layer may include, for example, a first inorganic encapsulation layer, an organic encapsulation layer, and a second inorganic encapsulation layer. In exemplary embodiments, various components in addition to the encapsulation layer may be located between the second conductive layer 2CL and the polarization plate 400.

Figure 4:
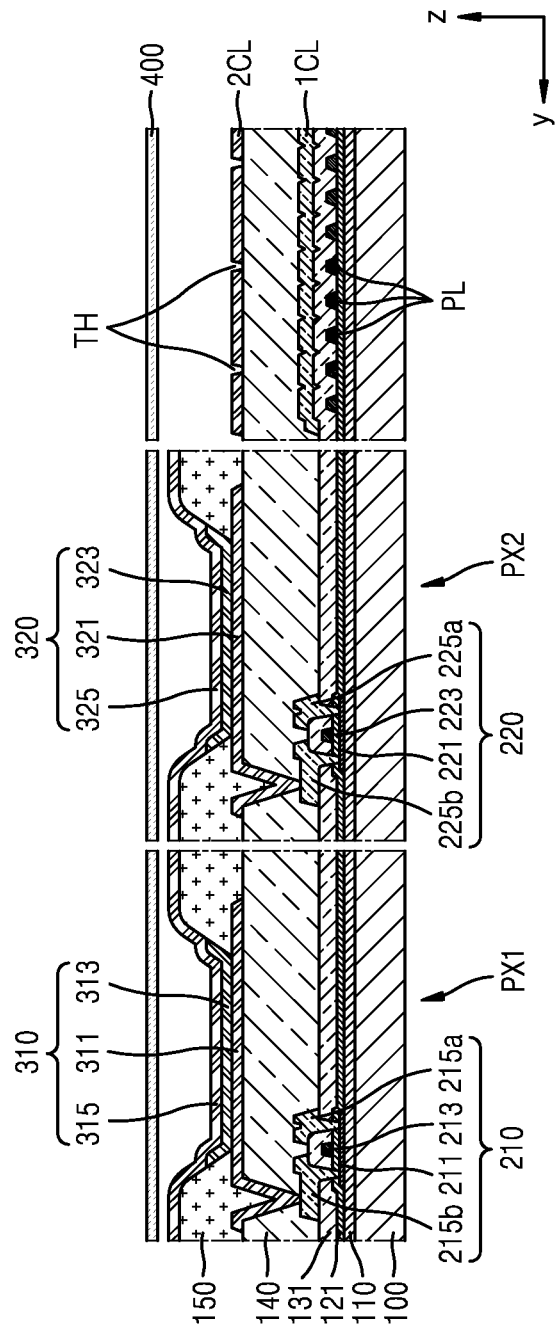
FIG. 4 is a schematic cross-sectional view of a portion of a display apparatus according to an exemplary embodiment.

FIG. 4 is a schematic cross-sectional view of a portion of a display apparatus according to an exemplary embodiment. The display apparatus according to the exemplary embodiment of FIG. 4 differs from the display apparatus described above with reference to FIG. 3 in that a second conductive layer 2CL has a through hole TH.

As described above, a planarization layer 140 is located on a first conductive layer 1CL including an upper surface having a second concave-convex surface. In addition, since the planarization layer 140 includes an organic material, even when the first conductive layer 1CL having the second concave-convex surface is disposed below the planarization layer 140, the upper surface of the planarization layer 140 has a substantially flat shape. Since the planarization layer 140 includes an organic material, a gas may be generated by the planarization layer 140 during a manufacturing process after the planarization layer 140 is formed, or during use after the completion of the manufacturing process. When this gas is not exhausted to the outside, the planarization layer 140 may swell later. This may cause defects to occur in a conductive layer or a wiring line disposed over and below the planarization layer 140. Allowing for the generated gas to be exhausted to the outside may prevent such defects from occurring.

In the display apparatus according to the exemplary embodiment of FIG. 4, the second conductive layer 2CL includes the through hole TH. Accordingly, a gas generated by the planarization layer 140 having an organic material may be exhausted to the outside via the through hole TH, and thus, the occurrence of defects as described above may be effectively prevented or reduced.

The through hole TH of the second conductive layer 2CL may be located over a plurality of wiring lines PL. As described above, the second conductive layer 2CL reflects light transmitted through a polarization plate 400 and transmits the light through the polarization plate 400 again. However, since the second conductive layer 2CL includes the through hole TH, when light transmitted through the polarization plate 400 passes through the through hole TH, the light is not reflected by the second conductive layer 2CL and is instead reflected by a conductive layer located below the second conductive layer 2CL. As described above, an upper surface of the first conductive layer 1CL has a second concave-convex surface. Image visibility degradation may not occur when light is reflected by a relatively flat portion of the second concave-convex surface of the first conductive layer 1CL. However, when light is reflected by a "V"-shaped valley instead of a relatively flat portion of the second concave-convex surface, the light is diffusely reflected, which may degrade image visibility, as described above. Thus, in an exemplary embodiment, the through hole TH is located over the plurality of wiring lines PL so that light passing through the through hole TH is reflected by a relatively flat upper surface even if the light is reflected by the upper surface of the first conductive layer 1CL. Accordingly, the light passing through the through hole TH may be reflected by a relatively flat portion of the upper surface of the first conductive layer 1CL, instead of by "V"-shaped valleys of the upper surface of the first conductive layer 1CL, thus preventing or reducing image visibility degradation.

Figure 5:
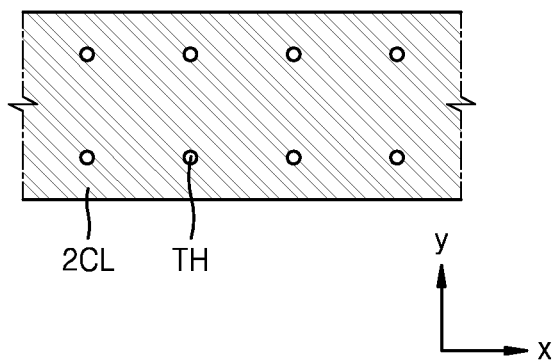
FIG. 5 is a schematic plan view of a portion of the display apparatus of FIG. 4.
Figure 6:
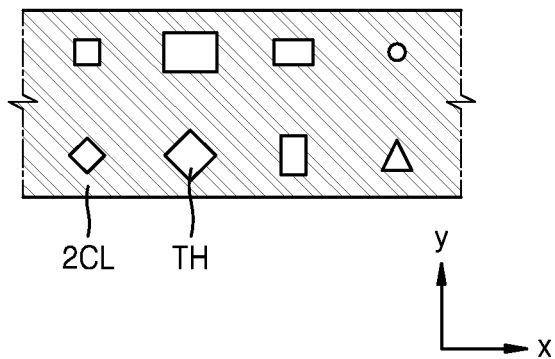
FIG. 6 is a schematic plan view of a portion of a display apparatus according to an exemplary embodiment.
Figure 7:
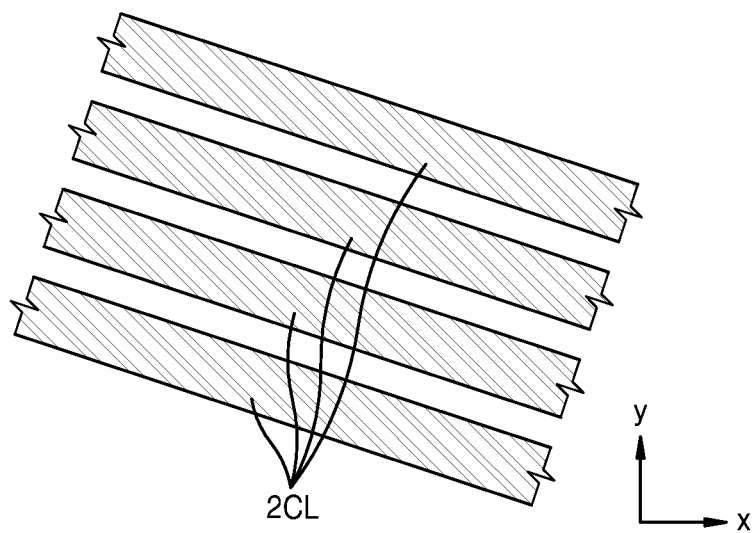
FIG. 7 is a schematic plan view of a portion of a display apparatus according to an exemplary embodiment.

The through hole TH in the second conductive layer 2CL may have various shapes. For example, as shown in FIG. 5, which is a schematic plan view of the second conductive layer 2CL according to an exemplary embodiment, the second conductive layer 2CL may have a through hole TH having a substantially circular shape. Alternatively, as shown in FIG. 6, which is a schematic plan view of the second conductive layer 2CL according to an exemplary embodiment, the through hole TH may have various shapes such as a square or a triangle in a plan view, and the size of the through hole TH may also vary depending on the location thereof. Furthermore, as shown in FIG. 7, which is a schematic plan view of the second conductive layer 2CL according to an exemplary embodiment, the second conductive layer 2CL does not include the through hole TH in an exemplary embodiment, and instead includes a plurality of wiring lines spaced apart from each other.

Figure 8:
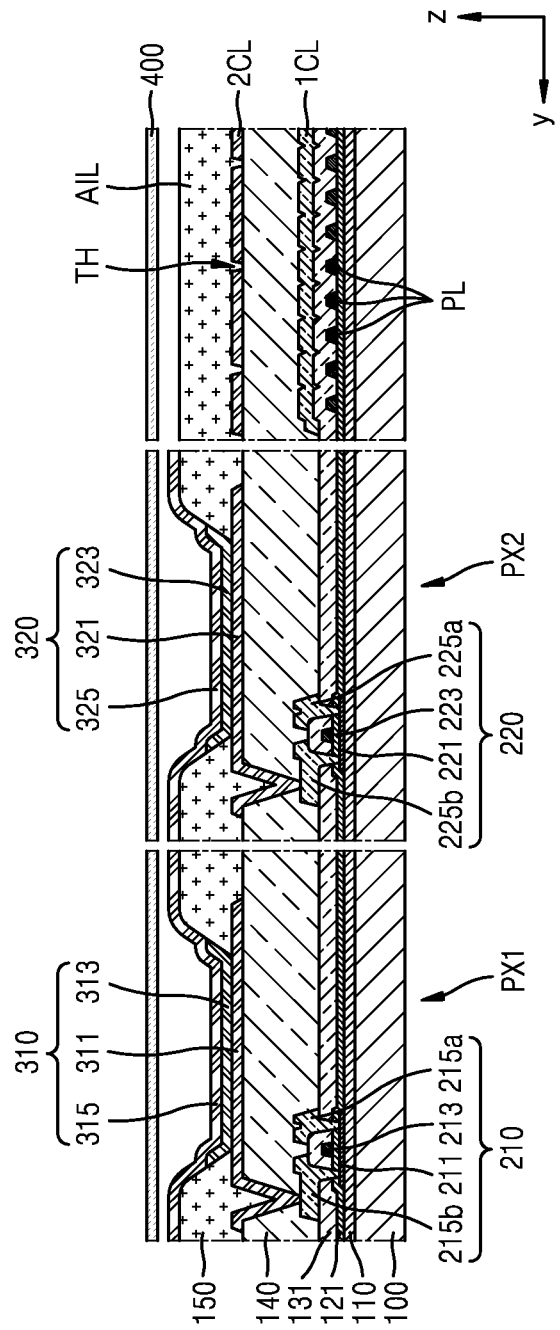
FIG. 8 is a schematic cross-sectional view of a portion of a display apparatus according to an exemplary embodiment.

FIG. 8 is a schematic cross-sectional view of a portion of a display apparatus according to an exemplary embodiment. The display apparatus according to the exemplary embodiment of FIG. 8 is different from the display apparatus described above with reference to FIG. 4 in that the display apparatus according to the exemplary embodiment of FIG. 8 further includes an additional insulating layer AIL filling a through hole TH of a second conductive layer 2CL. The additional insulating layer AIL may be disposed between the second conductive layer 2CL and a polarization plate 400, as shown in FIG. 8.

As described above, the second conductive layer 2CL may be formed on a planarization layer 140 simultaneously with a first pixel electrode 311 and a second pixel electrode 321 in a display area DA by using the same material as that of the first pixel electrode 311 and the second pixel electrode 321. As described above, a pixel-defining layer 150 covering the edges of the first pixel electrode 311 and the second pixel electrode 321 is located in the display area DA. Thus, the additional insulating layer AIL may be formed simultaneously with the pixel-defining layer 150 by using the same material as that of the pixel-defining layer 150 when the pixel-defining layer 150 is formed. Furthermore, the additional insulating layer AIL may be integrally formed with the pixel-defining layer 150. In this case, the additional insulating layer AIL may be understood as a portion of the pixel-defining layer 150 extending to the outside of the display area DA.

The exemplary embodiment of FIG. 8 is not limited thereto. For example, in an exemplary embodiment, the additional insulating layer AIL does not include the same material as the pixel-defining layer 150, and may include an inorganic material. In the drawings of illustrated exemplary embodiments to be described later, it is shown that the additional insulating layer AIL does not include the same material as the pixel-defining layer 150 for the sake of convenience. However, in the exemplary embodiments to be described later, the additional insulating layer AIL may include the same material as the pixel-defining layer 150, and the height of the additional insulating layer AIL may be the same as the height of the pixel-defining layer 150.

Figure 9:
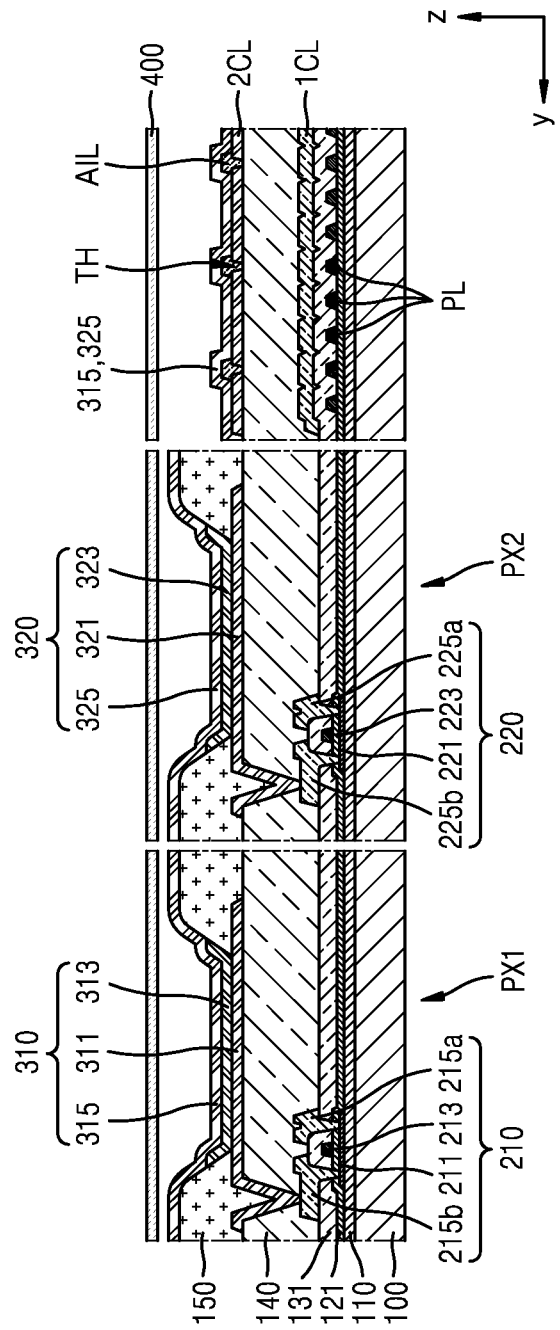
FIG. 9 is a schematic cross-sectional view of a portion of a display apparatus according to an exemplary embodiment.

FIG. 9 is a schematic cross-sectional view of a portion of a display apparatus according to an exemplary embodiment. As shown in FIG. 9, in an exemplary embodiment, an additional insulating layer AIL fills a through hole TH of a second conductive layer 2CL and exposes at least a portion of the upper surface of the second conductive layer 2CL. Opposite electrodes 315 and 325 in a display area DA extend to the outside of the display area DA and contact the upper surface of the second conductive layer 2CL.

A first display device 310, which is an organic light-emitting device, includes a pixel electrode 311, an opposite electrode 315, and an intermediate layer 313 including an emission layer disposed therebetween, as described above. The structure of a second display device 320 is the same as that of the first display device 310. In an exemplary embodiment, the opposite electrodes 315 and 325 of the first and second display devices 310 and 320, which are organic light-emitting devices that are integrally formed, are to be maintained at a constant potential. To this end, the opposite electrodes 315 and 325 may be in contact with the second conductive layer 2CL in an area outside of the display area DA, and may be maintained at a constant potential by the second conductive layer 2CL. The second conductive layer 2CL may be connected to a first conductive layer 1CL disposed below the second conductive layer 2CL through a contact hole formed in a planarization layer 140, and may have the same potential as the first conductive layer 1CL. For example, as the first conductive layer 1CL is electrically connected to an electronic device such as an integrated circuit or a printed circuit board, the first conductive layer 1CL and the second conductive layer 2CL are connected to each other, and the opposite electrodes 315 and 325 are in contact with the second conductive layer 2CL. Thus, the opposite electrodes 315 and 325 may be maintained at a constant potential when the display apparatus is driven.

Figure 10:
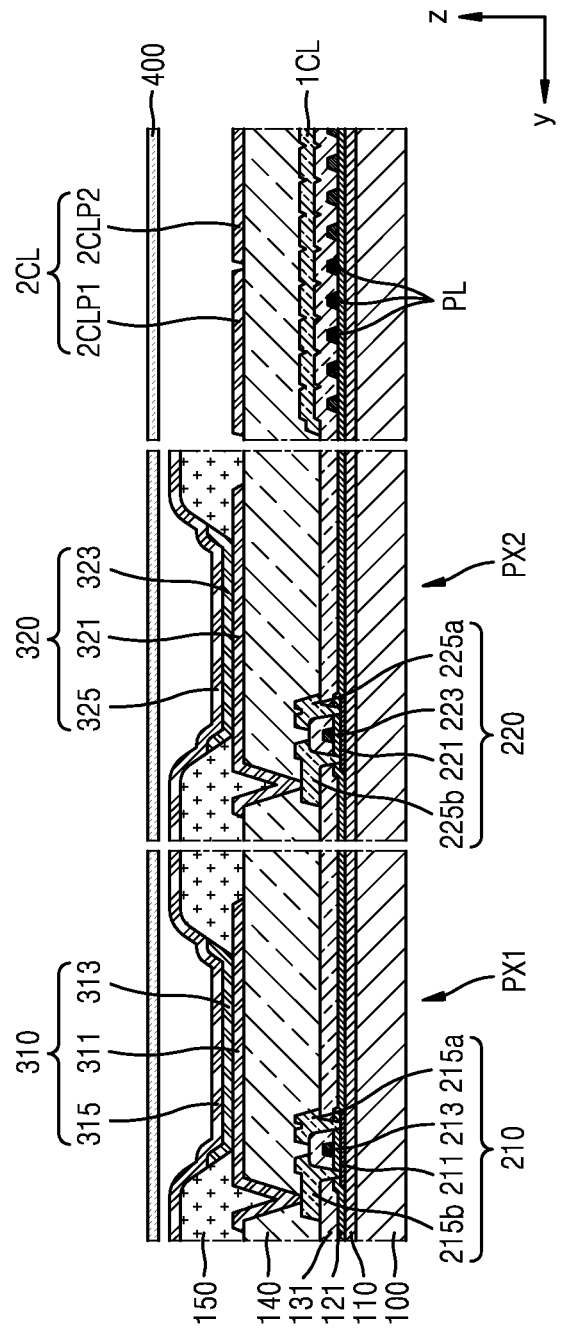
FIG. 10 is a schematic cross-sectional view of a portion of a display apparatus according to an exemplary embodiment.

FIG. 10 is a schematic cross-sectional view of a portion of a display apparatus according to an exemplary embodiment. As shown in FIG. 10, in an exemplary embodiment, a second conductive layer 2CL may include a first portion 2CLP1 and a second portion 2CLP2 spaced apart from the first portion 2CLP1.

In this case, a space between the first portion 2CLP1 and the second portion 2CLP2 may be located above any one of a plurality of wiring lines PL. For example, in an exemplary embodiment, the space between the first portion 2CLP1 and the second portion 2CLP2 is aligned with any one of the plurality of wiring lines PL. As described above, the second conductive layer 2CL reflects light transmitted through a polarization plate 400 and transmits the light through the polarization plate 400 again. However, since the second conductive layer 2CL has the first portion 2CLP1 and the second portion 2CLP2 spaced apart from each other, when light transmitted through the polarization plate 400 passes through the space between the first portion 2CLP1 and the second portion 2CLP2, the light is reflected by a conductive layer located below the second conductive layer 2CL without being reflected by the second conductive layer 2CL. As described above, an upper surface of a first conductive layer 1CL has a second concave-convex surface. Image visibility degradation may not occur when light is reflected by a relatively flat portion of the second concave-convex surface of the first conductive layer 1CL. However, when light is reflected by a "V"-shaped valley instead of a relatively flat portion of the second concave-convex surface, the light is diffusely reflected, which may cause image visibility degradation, as described above. Thus, the space between the first portion 2CLP1 and the second portion 2CLP2 of the second conductive layer 2CL may be located over the plurality of wiring lines PL so that light passing through the space between the first portion 2CLP1 and the second portion 2CLP2 of the second conductive layer 2CL is reflected by a relatively flat upper surface even if the light is reflected by the upper surface of the first conductive layer 1CL. Accordingly, the light passing through the space between the first portion 2CLP1 and the second portion 2CLP2 of the second conductive layer 2CL may be reflected by a relatively flat portion of the upper surface of the first conductive layer 1CL, instead of by "V"-shaped valleys of the upper surface of the first conductive layer 1CL, thus preventing or reducing image visibility degradation.

Figure 11:
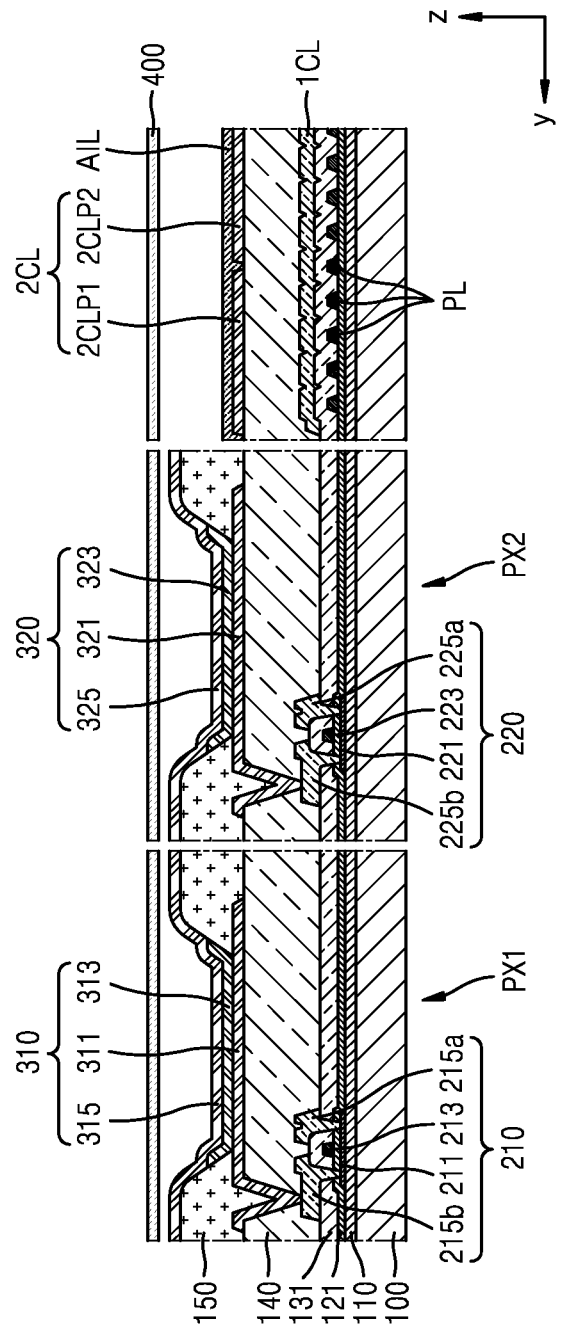
FIG. 11 is a schematic cross-sectional view of a portion of a display apparatus according to an exemplary embodiment.

FIG. 11 is a schematic cross-sectional view of a portion of a display apparatus according to an exemplary embodiment. The display apparatus according to the exemplary embodiment of FIG. 11 is different from the display apparatus according to the exemplary embodiment of FIG. 10 in that the display apparatus according to the exemplary embodiment of FIG. 11 further includes an additional insulating layer AIL filling a space between a first portion 2CLP1 and a second portion 2CLP2 of a second conductive layer 2CL. The additional insulating layer AIL may be disposed between the second conductive layer 2CL and a polarization plate 400, as shown in FIG. 11.

In FIG. 11, a material of the additional insulating layer AIL is different from that of a pixel-defining layer 150 in a display area DA, and a thickness of the additional insulating layer AIL is different from that of the pixel-defining layer 150. However, the exemplary embodiment of FIG. 11 is not limited thereto. For example, in an exemplary embodiment, the additional insulating layer AIL may be formed simultaneously with the pixel-defining layer 150 by using the same material as that of the pixel-defining layer 150 when the pixel-defining layer 150 is formed. Furthermore, the additional insulating layer AIL may be integrally formed with the pixel-defining layer 150. In this case, the additional insulating layer AIL may be understood as a portion of the pixel-defining layer 150 extending to the outside of the display area DA.

Figure 12:
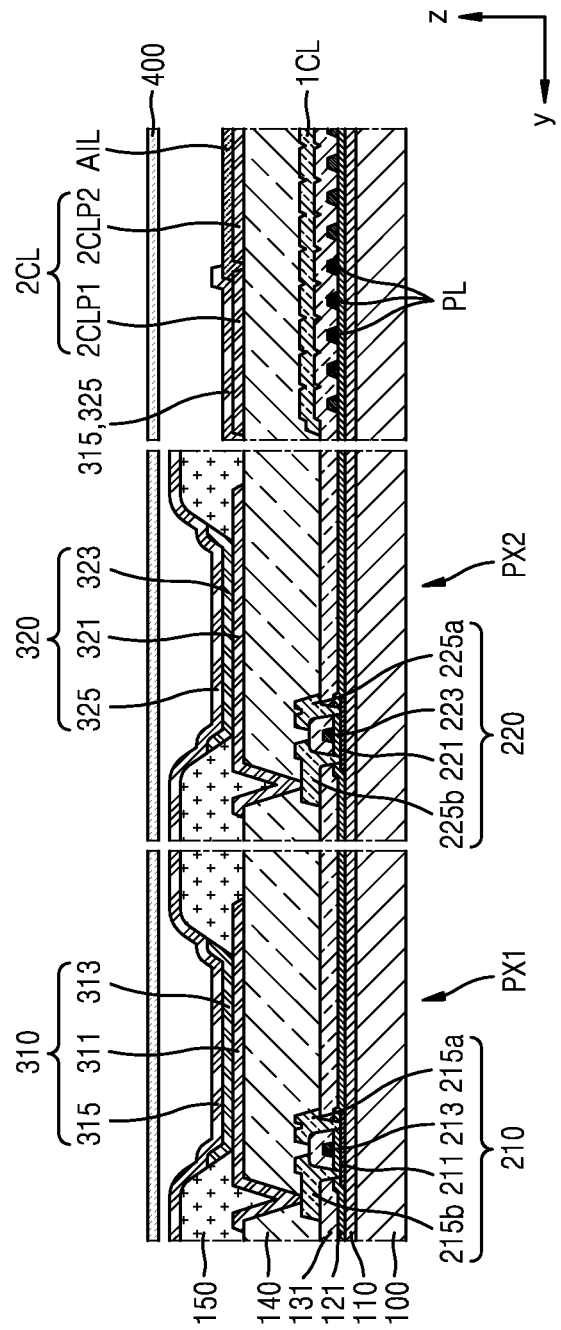
FIG. 12 is a schematic cross-sectional view of a portion of a display apparatus according to an exemplary embodiment.

FIG. 12 is a schematic cross-sectional view of a portion of a display apparatus according to an exemplary embodiment. As shown in FIG. 12, in an exemplary embodiment, an additional insulating layer AIL fills a space between a first portion 2CLP1 and a second portion 2CLP2 of a second conductive layer 2CL and exposes at least a portion of the upper surface of the first portion 2CLP1. Opposite electrodes 315 and 325 of a display area DA extend to the outside of the display area DA and contact the upper surface of the first portion 2CLP1.

By adopting this structure, the opposite electrodes 315 and 325 may be in contact with the first portion 2CLP1 of the second conductive layer 2CL in an area outside of the display area DA and be maintained at a constant potential by the first portion 2CLP1. The first portion 2CLP1 of the second conductive layer 2CL may be connected to a first conductive layer 1CL below the second conductive layer 2CL through a contact hole formed in a planarization layer 140, and may have the same potential as the first conductive layer 1CL. For example, as the first conductive layer 1CL is electrically connected to an electronic device such as an integrated circuit or a printed circuit board, the first conductive layer 1CL and the first portion 2CLP1 of the second conductive layer 2CL are connected to each other, and the opposite electrodes 315 and 325 are in contact with the first portion 2CLP1 of the second conductive layer 2CL. Thus, the opposite electrodes 315 and 325 may be maintained at a constant potential when the display apparatus is driven.

The second portion 2CLP2 of the second conductive layer 2CL may be electrically connected to a first pixel electrode 311 in the display area DA. As will be described later with reference to FIG. 19, a power supply line VDD is disposed in the display area DA, and the power supply line VDD is electrically connected to either a source electrode or a drain electrode of a first thin film transistor 210. As a result, the power supply line VDD is electrically connected to the first pixel electrode 311 of a first display device 310. The power supply line VDD may be arranged to cross the display area DA and may be electrically connected to the second portion 2CLP2 of the second conductive layer 2CL in an area outside of the display area DA. For example, as the second portion 2CLP2 of the second conductive layer 2CL is electrically connected to an electronic device such as an integrated circuit or a printed circuit board, the second portion 2CLP2 of the second conductive layer 2CL is electrically connected to the power supply line VDD, and the power supply line VDD is electrically connected to the first pixel electrode 311 of the first display device 310 through the first thin film transistor 210. Thus, power required for driving the first display device 310 may be supplied to the first display device 310.

Figure 13:
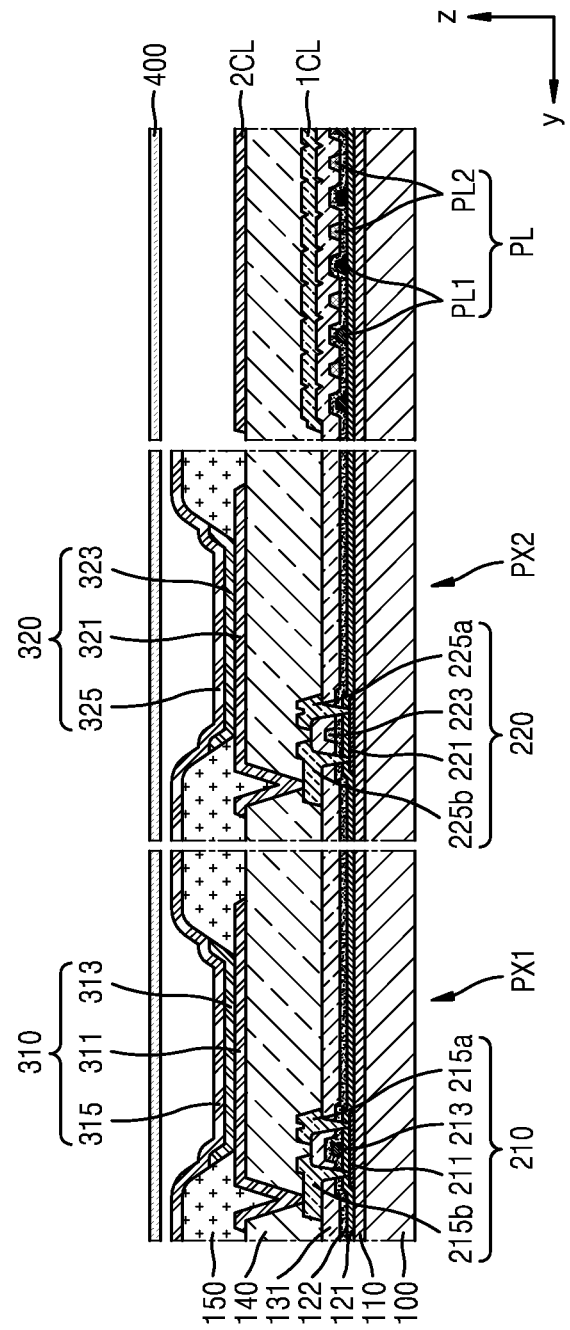
FIG. 13 is a schematic cross-sectional view of a portion of a display apparatus according to an exemplary embodiment.

A case in which the first gate electrode 213 of the first thin film transistor 210 and the second gate electrode 223 of the second thin film transistor 220 are located on the same layer has been described above. However, exemplary embodiments are not limited thereto. For example, as shown in FIG. 13, which is a cross-sectional view of a portion of a display apparatus according to an exemplary embodiment, a second gate insulating layer 122 covering the first gate electrode 213 of the first thin film transistor 210 may be further provided in addition to the first gate insulating layer 121, and the second gate electrode 223 of the second thin film transistor 220 may be located on the second gate insulating layer 122. For example, the first gate electrode 213 and the second gate electrode 223 may be located on different layers. The first source electrode 215a, the first drain electrode 215b, the second source electrode 225a, and the second drain electrode 225b are located on the first interlayer insulating layer 131 that covers the second gate electrode 223. The second gate insulating layer 122 may include an inorganic material such as, for example, silicon oxide, silicon nitride, and/or silicon oxynitride.

In this case, the plurality of wiring lines PL may include a plurality of first wiring lines PL1 and a plurality of second wiring lines PL2. The plurality of first wiring lines PL1 may be located on the same layer on which the first gate electrode 213 of the first thin film transistor 210 is located, and the plurality of second wiring lines PL2 may be located on the same layer on which the second gate electrode 223 of the second thin film transistor 220 is located. For example, during the manufacture of the display apparatus, the plurality of first wiring lines PL1 may be formed simultaneously with the first gate electrode 213 of the first thin film transistor 210 by using the same material as that used to form the first gate electrode 213 of the first thin film transistor 210, and the plurality of second wiring lines PL2 may be formed simultaneously with the second gate electrode 223 of the second thin film transistor 220 by using the same material as that used to form the second gate electrode 223 of the second thin film transistor 220.

In addition, the location of the plurality of first wiring lines PL1 and the plurality of second wiring lines PL2 may alternate with each other. The plurality of second wiring lines PL2 may be located to correspond to the spaces between the plurality of first wiring lines PL1. When the number of wiring lines PL increases in the peripheral area PA and all of the plurality of wiring lines PL are located on the same layer, an interval between the wiring lines PL decreases, and a short-circuit may occur between the wiring lines PL. However, the plurality of first wiring lines PL1 and the plurality of second wiring lines PL2 alternate with each other with the second gate insulating layer 122 disposed between the plurality of first wiring lines PL1 and the plurality of second wiring lines PL2, thereby effectively preventing the occurrence of a short-circuit.

Even in this case, the upper surface of the second gate insulating layer 122 is not flat due to the plurality of first wiring lines PL1 disposed below the second gate insulating layer 122. Similarly, the upper surface of the first interlayer insulating layer 131 covering the second gate insulating layer 122 and the plurality of second wiring lines PL2 is not flat. For example, similar to the upper surface of the first interlayer insulating layer 131 of the display apparatus according to the exemplary embodiment of FIG. 3 and the like, an upper surface of the first interlayer insulating layer 131 of FIG. 13 has the first concave-convex surface having the "V"-shaped valleys at locations corresponding to the spaces between the plurality of wiring lines PL. In FIG. 13, a first conductive layer 1CL disposed over the first interlayer insulating layer 131 also has an upper surface having a second concave-convex surface corresponding to the first concave-convex surface.

In the display apparatus according to the exemplary embodiment of FIG. 13, similar to the display apparatus according to the exemplary embodiment of FIG. 3, a planarization layer 140 having a substantially flat upper surface covers the first conductive layer 1CL, and a second conductive layer 2CL having a substantially flat upper surface is located on the planarization layer 140. Accordingly, occurrence of a problem due to diffuse reflection or the like may be effectively prevented or reduced.

The display apparatus according to the exemplary embodiment of FIG. 13 may be modified in various ways. For example, all features according to the exemplary embodiments described above with reference to FIGS. 4 through 12 are equally applicable to the display apparatus of FIG. 13, except that the plurality of wiring lines PL includes the plurality of first wiring lines PL1 and the plurality of second wiring lines PL2, and the plurality of first wiring lines PL1 and the plurality of second wiring lines PL2 are located on different layers.

Figure 14:
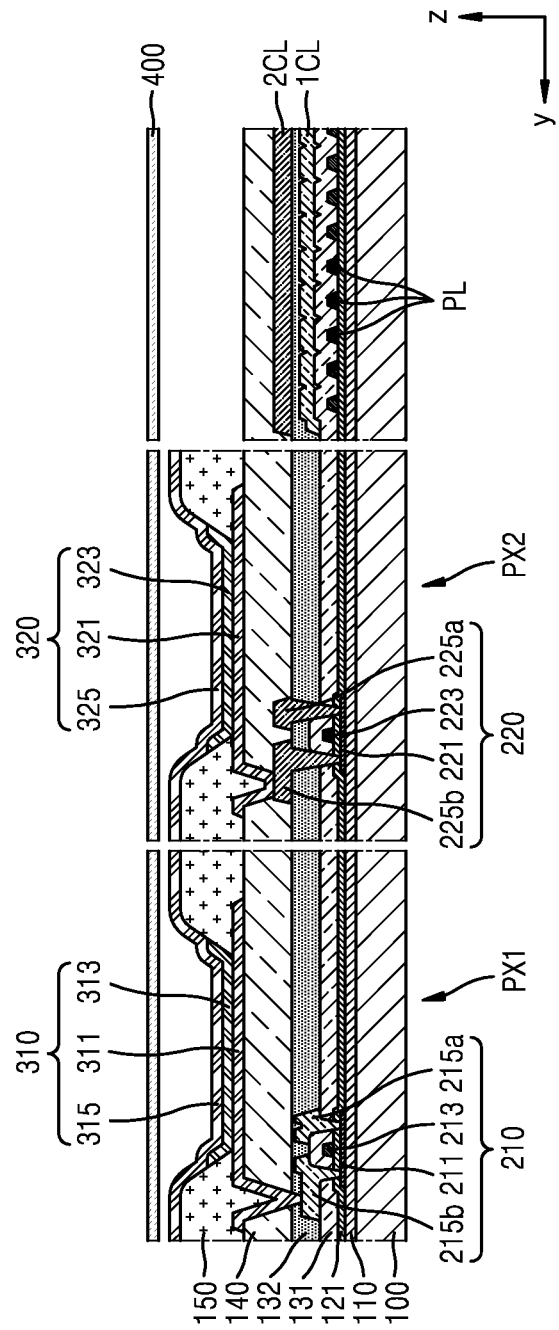
FIG. 14 is a schematic cross-sectional view of a portion of a display apparatus according to an exemplary embodiment.

A case in which the first source electrode 215a and the first drain electrode 215b of the first thin film transistor 210, and the second source electrode 225a and the second drain electrode 225b of the second thin film transistor 220, are located on the same layer has been described above. However, exemplary embodiments are not limited thereto. For example, FIG. 14 illustrates a cross-sectional view of a portion of a display apparatus according to an exemplary embodiment in which a second interlayer insulating layer 132 covering the first source electrode 215a and the first drain electrode 215b of the first thin film transistor 210 may be further included in addition to the first interlayer insulating layer 131 covering the first or second gate electrode 213 or 223, and the second source electrode 225a and the second drain electrode 225b of the second thin film transistor 220 may be located on the second interlayer insulating layer 132. The first source electrode 215a and the first drain electrode 215b may be disposed on a different layer from a layer on which the second source electrode 225a and the second drain electrode 225b are located. The second interlayer insulating layer 132 may be formed of an organic material such as, for example, PI or HMDSO. In an exemplary embodiment, the first source electrode 215a and the first drain electrode 215b may include the same material as the second source electrode 225a and the second drain electrode 225b, and may have the same structure as the second source electrode 225a and the second drain electrode 225b.

In this case, in the peripheral area PA, the first conductive layer 1CL located over the first interlayer insulating layer 131 covering the plurality of wiring lines PL may be covered by the second interlayer insulating layer 132. The second interlayer insulating layer 132 may be formed to have a substantially flat upper surface by including an organic material. Accordingly, the second conductive layer 2CL is formed on the second interlayer insulating layer 132 such that the upper surface of the second conductive layer 2CL is also substantially flat. Consequently, external light may be reflected by the second conductive layer 2CL having the substantially flat upper surface before reaching the first conductive layer 1CL of which the upper surface is not flat. For example, the second interlayer insulating layer 132 of the display apparatus according to the exemplary embodiment of FIG. 14 may be understood as serving as the planarization layers 140 of the display apparatuses according to the above-described exemplary embodiments.

Since the second conductive layer 2CL is located on the second interlayer insulating layer 132, the first conductive layer 1CL may be formed simultaneously with the first source electrode 215a and the first drain electrode 215b in the same layer as the first source electrode 215a and the first drain electrode 215b by using the same material as that of the first source electrode 215a and the first drain electrode 215b of the first thin film transistor 210. Further, the second conductive layer 2CL may be formed simultaneously with the second source electrode 225a and the second drain electrode 225b in the same layer as the second source electrode 225a and the second drain electrode 225b by using the same material as that of the second source electrode 225a and the second drain electrode 225b of the second thin film transistor 220. As illustrated in FIG. 14, the second conductive layer 2CL is covered by the planarization layer 140.

In FIG. 14, the second conductive layer 2CL is located on the same layer as the second source electrode 225a and the second drain electrode 225b of the second thin film transistor 220. However, exemplary embodiments are not limited thereto. For example, in an exemplary embodiment, unlike in FIG. 14, the second thin film transistor 220 is not present, and the second display device 320 may be electrically connected to a thin film transistor located below the second display device 320 and having the same layered structure as that of the first thin film transistor 210 (as shown in FIG. 13 and the like). In this case, an intermediate conductive layer may be located between a source electrode of the thin film transistor and the second display device 320. The position of the intermediate conductive layer may be the same as the position of the second source electrode 225a in FIG. 14. For example, source electrodes of thin film transistors disposed under the first and second display devices 310 and 320 may be covered by the second interlayer insulating layer 132, and an intermediate conductive layer may be located on the second interlayer insulating layer 132. In this case, during the manufacture of the display apparatus, the second conductive layer 2CL may be formed simultaneously with the intermediate conductive layer in the same layer as the intermediate conductive layer by using the same material as that of the intermediate conductive layer. For reference, FIG. 4 illustrates a case in which the intermediate conductive layer is the second source electrode 225a. This is equally applicable to the exemplary embodiments to be described later and modifications thereof.

The second conductive layer 2CL located on the second interlayer insulating layer 132 may have a through hole or may have a first portion and a second portion which are spaced apart from each other. The description provided above with reference to FIGS. 4 through 12 may be applied to the structure of the second conductive layer 2CL. When the second conductive layer 2CL has the through hole or has the first portion and the second portion that are spaced apart from each other, the through hole or a space between the first portion and the second portion is filled with a planarization layer 140. Thus, the planarization layer 140 may be understood as an additional insulating layer filling the through hole in the second conductive layer 2CL or filling the space between the first portion and the second portion in the second conductive layer 2CL. For example, the additional insulating layer may be understood as a portion formed by extending the planarization layer 140 in the display area DA to the outside of the display area DA. The planarization layer 140 may have a discontinuous section outside of the display area DA.

In FIG. 14, the first source electrode 215a and the first drain electrode 215b are located on a different layer from a layer on which the second source electrode 225a and the second drain electrode 225b are located. However, exemplary embodiments are not limited thereto. For example, in an exemplary embodiment, the second source electrode 225a and the second drain electrode 225b may be located on the first interlayer insulating layer 131, similar to the first source electrode 215a and the first drain electrode 215b, and a conductive layer may be located on the second interlayer insulating layer 132 to serve as a wiring line or a connection layer. In this case, the first conductive layer 1CL may be located on the first interlayer insulating layer 131, similar to the first source electrode 215a, the first drain electrode 215b, the second source electrode 225a, and the second drain electrode 225b, and the second conductive layer 2CL may be located on the second interlayer insulating layer 132, similar to the conductive layer used to serve as a wiring line or a connection layer in the display area DA. Thus, even in this case, the same structure as shown in FIG. 14 may be used in the peripheral area PA.

Figure 15:
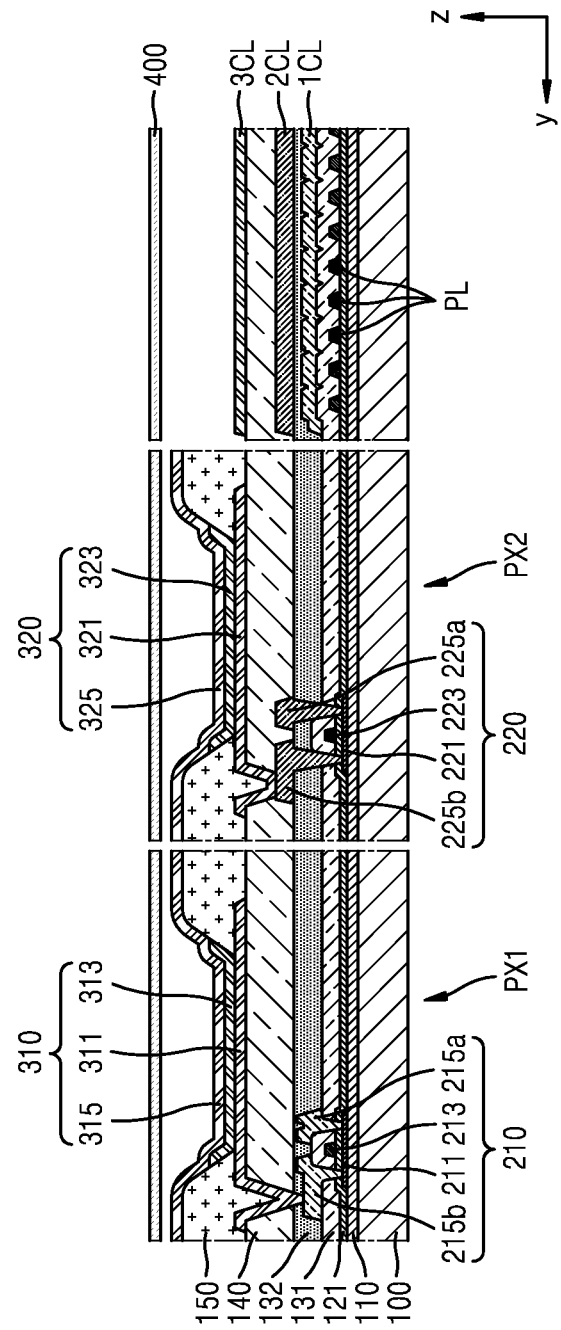
FIG. 15 is a schematic cross-sectional view of a portion of a display apparatus according to an exemplary embodiment.

FIG. 15 is a schematic cross-sectional view of a portion of a display apparatus according to an exemplary embodiment. The display apparatus according to the exemplary embodiment of FIG. 15 further includes a third conductive layer 3CL located on a planarization layer 140 covering a second conductive layer 2CL, unlike the display apparatus described above with reference to FIG. 14. In this case, since the third conductive layer 3CL is located on the same layer as a first pixel electrode 311 in the display area DA, the third conductive layer 3CL may be formed simultaneously with the same material as the first pixel electrode 311 during the manufacture of the display apparatus.

When the second conductive layer 2CL is located on the second interlayer insulating layer 132 as shown in FIG. 14, the second conductive layer 2CL may include a plurality of interconnection lines spaced apart from each other. When the second conductive layer 2CL includes the plurality of interconnection lines spaced apart from each other, if a portion of light transmitted through a polarization plate 400 passes through spaces between the interconnection lines, the portion of the light is reflected by an upper surface of a first conductive layer 1CL located below the second conductive layer 2CL without being reflected by the second conductive layer 2CL. As described above, since the upper surface of the first conductive layer 1CL has a second concave-convex surface, the portion of the light may be diffusely reflected by the upper surface of the first conductive layer 1CL, thereby causing image visibility degradation, as described above.

However, in the display apparatus according to the exemplary embodiment of FIG. 15, since the third conductive layer 3CL is located over the second conductive layer 2CL, light transmitted through the polarization plate 400 is reflected by the third conductive layer 3CL. Thus, even if the second conductive layer 2CL includes a plurality of interconnection lines spaced apart from each other, image visibility degradation may be avoided. The third conductive layer 3CL may have a through hole. In this case, the through hole in the third conductive layer 3CL may be located on the plurality of interconnection lines in the second conductive layer 2CL.

The planarization layer 140 is located between the second conductive layer 2CL having a plurality of interconnection lines and the third conductive layer 3CL, as shown in FIG. 15. Thus, the planarization layer 140 may be understood as an additional insulating layer filling spaces between the plurality of interconnection lines. For example, the additional insulating layer may be understood as a portion of the planarization layer 140 in the display area DA extending to the outside of the display area DA. The planarization layer 140 may have a discontinuous section outside of the display area DA.

Figure 16:
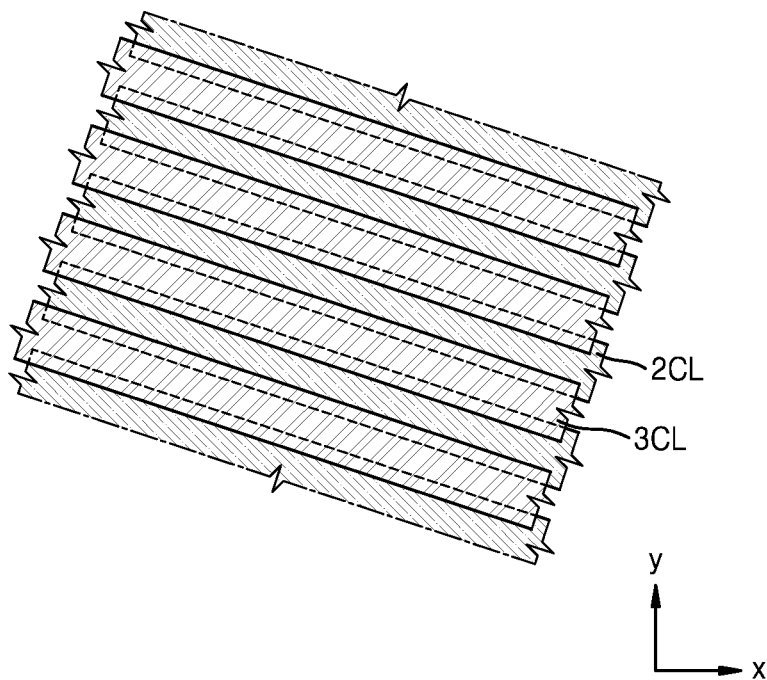
FIG. 16 is a schematic plan view of a portion of a display apparatus according to an exemplary embodiment.

When the second conductive layer 2CL includes a plurality of interconnection lines spaced apart from each other, the third conductive layer 3CL may also include a plurality of additional wiring lines spaced apart from each other. FIG. 16 is a plan view showing a case in which the second conductive layer 2CL includes a plurality of interconnection lines spaced apart from each another and the third conductive layer 3CL includes a plurality of additional wiring lines spaced apart from each other. In this case, spaces between the plurality of additional wiring lines are located over the plurality of interconnection lines, as shown in FIG. 16.

When the second conductive layer 2CL includes the plurality of interconnection lines spaced apart from each other, if a portion of light transmitted through a polarization plate 400 passes through the spaces between the interconnection lines, the portion of the light is reflected by an upper surface of a first conductive layer 1CL located below the second conductive layer 2CL without being reflected by the second conductive layer 2CL. As described above, since the upper surface of the first conductive layer 1CL has a second concave-convex surface, the portion of the light may be diffusely reflected by the upper surface of the first conductive layer 1CL, thereby causing image visibility degradation.

However, in the display apparatus according to the exemplary embodiment of FIG. 16, since the spaces between the plurality of additional wiring lines in the third conductive layer 3CL located over the second conductive layer 2CL are located over the interconnection lines in the second conductive lines 2CL, light transmitted through the polarization plate 400 is reflected by substantially flat upper surfaces of the plurality of additional wiring lines in the third conductive layer 3CL, or is reflected by substantially flat upper surfaces of the plurality of interconnection lines in the second conductive layer 2CL, and does not reach the first conductive layer 1CL below the second conductive layer 2CL. Thus, the occurrence of image visibility degradation due to diffuse reflection may be effectively prevented or reduced.

Figure 17:
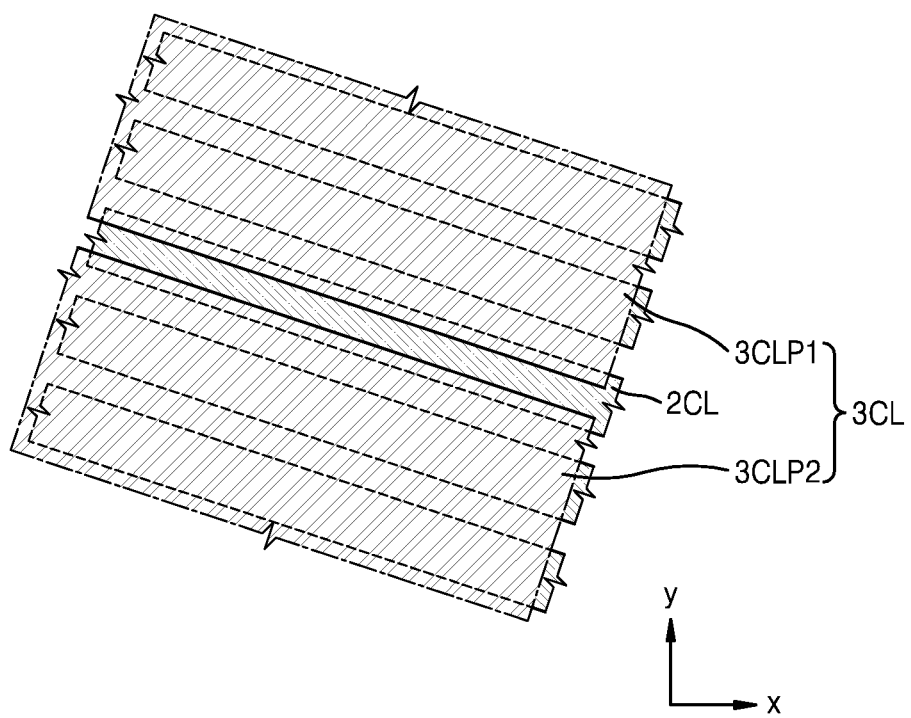
FIG. 17 is a schematic plan view of a portion of a display apparatus according to an exemplary embodiment.

In an exemplary embodiment, the plurality of additional wiring lines disposed in the third conductive layer 3CL does not correspond to the plurality of interconnection lines in the second conductive layer 2CL. For example, as shown in FIG. 17, which is a schematic plan view of a portion of a display apparatus according to an exemplary embodiment, the third conductive layer 3CL may include a first portion 3CLP1 and a second portion 3CLP2 spaced apart from each other. In this case, the first portion 3CLP1 may be located over a first group including two or more interconnection lines from among the plurality of interconnection lines in the second conductive layer 2CL, and the second portion 3CLP2 may be located over a second group including other two or more interconnection lines from among the plurality of interconnection lines in the second conductive layer 2CL. A space between the first portion 3CLP1 and the second portion 3CLP2 may be located over the plurality of interconnection lines in the second conductive layer 2CL. Thus, diffuse reflection by the first conductive layer 1CL may be prevented.

Figure 18:
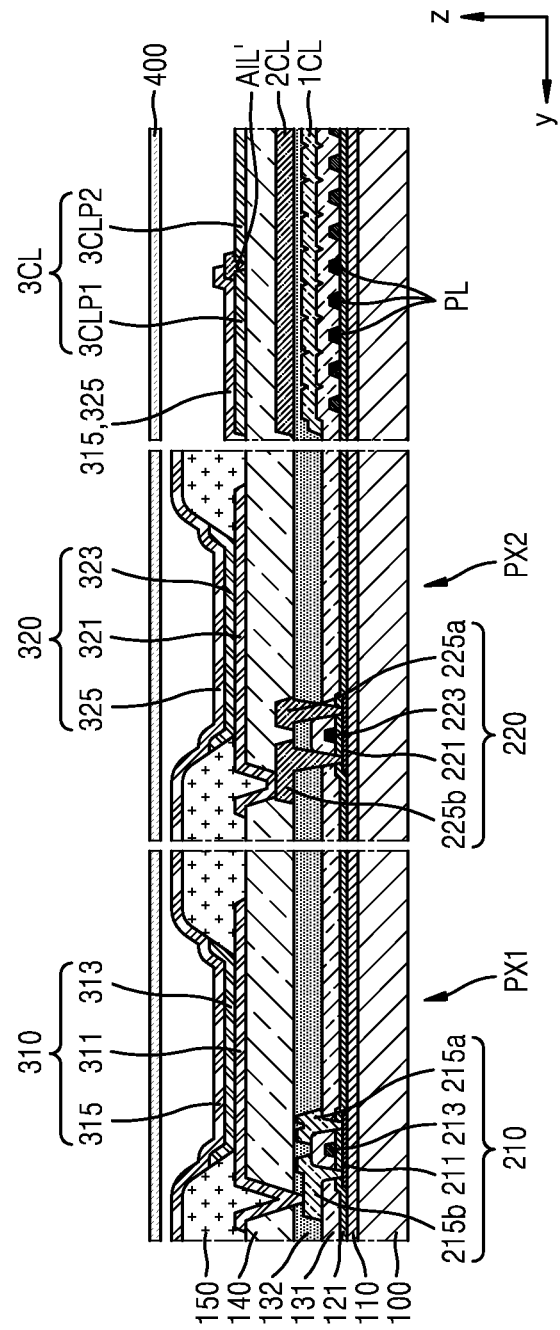
FIG. 18 is a schematic plan view of a portion of a display apparatus according to an exemplary embodiment.

When the third conductive layer 3CL includes the first portion 3CLP1 and the second portion 3CLP2, as shown in FIG. 18, which is a schematic plan view of a portion of a display apparatus according to an exemplary embodiment, an additional auxiliary insulating layer AIL' including an inorganic material or an organic material may fill a space between the first portion 3CLP1 and the second portion 3CLP2 of the third conductive layer 3CL, but may expose at least a portion of the upper surface of the first portion 3CLP1. Opposite electrodes 315 and 325 in a display area DA may extend to the outside of the display area DA and contact the upper surface of the first portion 3CLP1.

By adopting this structure, the opposite electrodes 315 and 325 may be in contact with the first portion 3CLP1 of the third conductive layer 3CL in an area outside of the display area DA, and may be maintained at a constant potential by the first portion 3CLP1. The first portion 3CLP1 of the third conductive layer 3CL may be connected to the first conductive layer 1CL and/or the second conductive layer 2CL below the third conductive layer 3CL through a contact hole formed in a planarization layer 140. For example, as the first conductive layer 1CL and/or the second conductive layer 2CL are electrically connected to an electronic device such as an integrated circuit or a printed circuit board, the first conductive layer 1CL and/or the second conductive layer 2CL, and the first portion 3CLP1 of the third conductive layer 3CL, are connected to each other, and the opposite electrodes 315 and 325 are in contact with the first portion 3CLP1 of the third conductive layer 3CL. Thus, the opposite electrodes 315 and 325 may be maintained at a constant potential when the display apparatus is driven.

Figure 19:
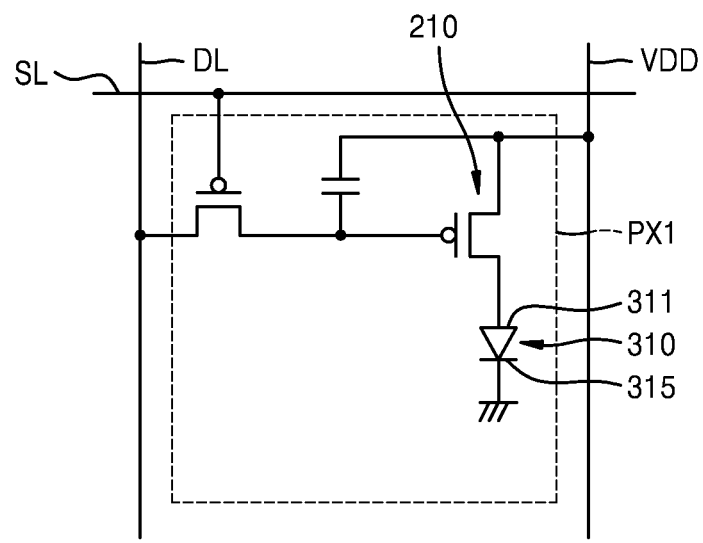
FIG. 19 is a schematic circuit diagram of a pixel of a display apparatus according to an exemplary embodiment.

The second portion 3CLP2 of the third conductive layer 3CL may be electrically connected to a first pixel electrode 311 in the display area DA. As shown in FIG. 19, a power supply line VDD is present in the display area DA, and the power supply line VDD is electrically connected to either a source electrode or a drain electrode of a first thin film transistor 210 in a first pixel PX1. As a result, the power supply line VDD is electrically connected to the first pixel electrode 311 of a first display device 310. The power supply line VDD may be arranged to cross the display area DA and may be electrically connected to the second portion 3CLP2 of the third conductive layer 3CL in an area outside of the display area DA. For example, as the second portion 3CLP2 of the third conductive layer 3CL is electrically connected to an electronic device such as an integrated circuit or a printed circuit board, the second portion 3CLP2 of the third conductive layer 3CL is electrically connected to the power supply line VDD, and the power supply line VDD is electrically connected to the first pixel electrode 311 of the first display device 310 through the first thin film transistor 210. Thus, power required for driving the first display device 310 may be supplied to the first display device 310.

FIG. 19 illustrates a power supply line VDD, a data line DL substantially parallel to the power supply line VDD, and a scan line SL extending in a direction intersecting with the data line DL. Such a data line DL transmits a data signal to the first display device 310 and the like. The data signal is transmitted from an integrated circuit or a printed circuit board located in the peripheral area PA to the data line via a plurality of wiring lines PL. The data line DL may be integrally formed with the plurality of wiring lines PL. Alternatively, the data line DL may be located on a different layer from a layer on which the plurality of wiring lines PL are located, but may be electrically connected to the plurality of wiring lines PL via a contact hole or the like.

The scan line SL simultaneously applies a scan signal to a plurality of display devices located on the same row. The scan signal may be generated in a driving circuit unit located in the peripheral area PA disposed around the display area DA. The driving circuit unit may include, for example, a shift register. In the exemplary embodiments described above with reference to FIGS. 15 through 17, the plurality of interconnection lines in the second conductive layer 2CL may be electrically connected to the driving circuit unit. For example, the plurality of interconnection lines may transmit an electrical signal from an integrated circuit or a printed circuit board located in the peripheral area PA to the driving circuit unit, and the driving circuit unit may generate an electrical signal that is to be applied to the display area DA.

Although various exemplary embodiments have been described above, exemplary embodiments are not limited thereto. For example, a display apparatus, in which a substrate has a display area and a peripheral area disposed outside of the display area, includes an interlayer insulating layer in the peripheral area that includes a first upper surface having a first concave-convex surface, a first conductive layer located on the interlayer insulating layer in the peripheral area that includes an upper surface having a second concave-convex surface corresponding to the first concave-convex surface, a planarization layer having a substantially flat upper surface located on the first conductive layer, a second conductive layer having a substantially flat upper surface located on the planarization layer, and a polarization plate located on the second conductive layer. Such a configuration may effectively prevent image visibility degradation due to the first concave-convex surface of the first conductive layer via the second conductive layer having a substantially flat upper surface.

Descriptions of features or aspects within each exemplary embodiment should typically be considered as available for other similar features or aspects in other exemplary embodiments, unless the context clearly indicates otherwise.

While one or more exemplary embodiments have been described with reference to the figures, it will be understood by those of ordinary skill in the art that various changes in form and detail may be made therein without departing from the spirit and scope as defined by the following claims.

What is claimed is:

1. A display apparatus, comprising:
   a substrate comprising a display area and a peripheral area disposed outside of the display area;
   a plurality of wiring lines disposed in the peripheral area;
   an interlayer insulating layer covering the plurality of wiring lines, wherein the interlayer insulating layer comprises an upper surface having a first concave-convex surface corresponding to the plurality of wiring lines;

a first conductive layer disposed on the interlayer insulating layer and comprising a second upper surface having a second concave-convex surface corresponding to the first concave-convex surface;
a planarization layer disposed on the first conductive layer and having a flat upper surface;
a second conductive layer disposed on the planarization layer and having a flat upper surface; and
a polarization plate disposed on the second conductive layer.

2. The display apparatus of claim 1, wherein the plurality of wiring lines comprises a plurality of first wiring lines and a plurality of second wiring lines.

3. The display apparatus of claim 2, wherein the plurality of first wiring lines and the plurality of second wiring lines are alternately disposed.

4. The display apparatus of claim 2, further comprising:
a first gate insulating layer disposed below the plurality of first wiring lines; and
a second gate insulating layer disposed below the interlayer insulating layer and covering the plurality of first wiring lines,
wherein the plurality of second wiring lines is disposed on the second gate insulating layer and corresponds to spaces between the plurality of first wiring lines.

5. The display apparatus of claim 1, wherein the second conductive layer comprises a through hole disposed above the plurality of wiring lines.

6. The display apparatus of claim 5, further comprising:
an additional insulating layer filling the through hole.

7. The display apparatus of claim 6, wherein the additional insulating layer is disposed between the second conductive layer and the polarization plate.

8. The display apparatus of claim 6, wherein the additional insulating layer exposes at least a portion of the upper surface of the second conductive layer.

9. The display apparatus of claim 8, further comprising:
a light-emitting device disposed in the display area and comprising a pixel electrode, an intermediate layer comprising an emission layer, and an opposite electrode, wherein the pixel electrode, the intermediate layer, and the opposite electrode are sequentially stacked,
wherein the opposite electrode extends to the peripheral area and contacts the upper surface of the second conductive layer.

10. The display apparatus of claim 9, wherein the second conductive layer is electrically connected to the first conductive layer.

11. The display apparatus of claim 1, wherein the second conductive layer comprises a first portion and a second portion spaced apart from each other.

12. The display apparatus of claim 11, wherein a space between the first portion and the second portion is aligned with one of the plurality of wiring lines.

13. The display apparatus of claim 11, further comprising:
an additional insulating layer filling a space between the first portion and the second portion.

14. The display apparatus of claim 13, wherein the additional insulating layer is disposed between the second conductive layer and the polarization plate.

15. The display apparatus of claim 13, wherein the additional insulating layer exposes at least a portion of an upper surface of the first portion.

16. The display apparatus of claim 15, further comprising:
a light-emitting device disposed in the display area and comprising a pixel electrode, an intermediate layer comprising an emission layer, and an opposite electrode, wherein the pixel electrode, the intermediate layer, and the opposite electrode are sequentially stacked,
wherein the opposite electrode extends to the peripheral area and contacts the upper surface of the first portion.

17. The display apparatus of claim 16, wherein the first portion is electrically connected to the first conductive layer.

18. The display apparatus of claim 16, wherein the second portion is electrically connected to the pixel electrode.

19. The display apparatus of claim 1, wherein the second conductive layer comprises a plurality of interconnection lines.

20. The display apparatus of claim 19, further comprising:
an additional insulating layer filling spaces between the plurality of interconnection lines.

21. The display apparatus of claim 20, wherein the additional insulating layer is disposed between the second conductive layer and the polarization plate.

22. The display apparatus of claim 19, further comprising:
a driving circuit disposed in the peripheral area, wherein the driving circuit generates an electrical signal to be applied to a plurality of display devices disposed in the display area,
wherein the plurality of interconnection lines is electrically connected to the driving circuit.

23. The display apparatus of claim 19, further comprising:
an additional insulating layer disposed between the second conductive layer and the polarization plate and having a flat upper surface; and
a third conductive layer disposed between the additional insulating layer and the polarization plate and having a flat upper surface.

24. The display apparatus of claim 23, wherein the third conductive layer comprises a plurality of additional wiring lines, and a plurality of spaces disposed between the plurality of additional wiring lines is disposed above the plurality of interconnection lines.

25. The display apparatus of claim 23, wherein the third conductive layer comprises a first portion and a second portion spaced apart from each other.

26. The display apparatus of claim 25, wherein a space between the first portion and the second portion is disposed above the plurality of interconnection lines.

27. The display apparatus of claim 25, further comprising:
a light-emitting device disposed in the display area and comprising a pixel electrode, an intermediate layer comprising an emission layer, and an opposite electrode, wherein the pixel electrode, the intermediate layer, and the opposite electrode are sequentially stacked,
wherein the opposite electrode extends to the peripheral area and contacts an upper surface of the first portion.

28. The display apparatus of claim 27, wherein the first portion is electrically connected to the first conductive layer.

29. The display apparatus of claim 27, wherein the second portion is electrically connected to the pixel electrode.

30. The display apparatus of claim 1, further comprising:
a light-emitting device disposed in the display area and comprising a pixel electrode, an intermediate layer comprising an emission layer, and an opposite electrode, wherein the pixel electrode, the intermediate layer, and the opposite electrode are sequentially stacked,
wherein the second conductive layer is disposed on a same layer as the pixel electrode.

31. The display apparatus of claim 1, further comprising:
a light-emitting device disposed in the display area and comprising a pixel electrode, an intermediate layer comprising an emission layer, and an opposite electrode, wherein the pixel electrode, the intermediate layer, and the opposite electrode are sequentially stacked;
a first thin film transistor disposed below the light-emitting device, and comprising a first gate electrode and a first source electrode disposed above the first gate electrode; and
an intermediate conductive layer disposed between the first source electrode and the light-emitting device,
wherein the first conductive layer is disposed on a same layer as the first source electrode, and the second conductive layer is disposed on a same layer as the intermediate conductive layer.

32. The display apparatus of claim 31, wherein the intermediate conductive layer is a second source electrode.

33. A display apparatus, comprising:
a substrate comprising a display area and a peripheral area disposed outside of the display area;
an interlayer insulating layer disposed in the peripheral area and comprising an upper surface having a first concave-convex surface;
a first conductive layer disposed on the interlayer insulating layer and comprising an upper surface having a second concave-convex surface corresponding to the first concave-convex surface;
a planarization layer disposed on the first conductive layer and having a flat upper surface;
a second conductive layer disposed on the planarization layer and having a flat upper surface; and
a polarization plate disposed on the second conductive layer.

* * * * *